United States Patent
Gonzalez

(10) Patent No.: US 10,056,522 B2
(45) Date of Patent: Aug. 21, 2018

(54) SYSTEM AND APPARATUS FOR PRECISION AUTOMATION OF TAB ATTACHMENT FOR FABRICATIONS OF SOLAR PANELS

(71) Applicant: SolarCity Corporation, San Mateo, CA (US)

(72) Inventor: Pablo Gonzalez, Fremont, CA (US)

(73) Assignee: SolarCity Corporation, San Mateo, CA (US)

( * ) Notice: Subject to any disclaimer, the term of this patent is extended or adjusted under 35 U.S.C. 154(b) by 192 days.

(21) Appl. No.: 14/930,616

(22) Filed: Nov. 2, 2015

(65) Prior Publication Data

US 2016/0163913 A1    Jun. 9, 2016

Related U.S. Application Data

(60) Provisional application No. 62/088,509, filed on Dec. 5, 2014, provisional application No. 62/143,694, filed on Apr. 6, 2015.

(51) Int. Cl.
*B23P 19/00* (2006.01)
*H01L 31/18* (2006.01)

(52) U.S. Cl.
CPC ........ *H01L 31/1876* (2013.01); *H01L 31/188* (2013.01); *Y02E 10/50* (2013.01); *Y10T 29/53174* (2015.01)

(58) Field of Classification Search
CPC ....... H01L 2225/06579; H01L 25/0657; Y10T 29/49117; Y10T 29/53174; Y10T 156/1768; B65G 57/04; Y02E 10/50
USPC ... 29/739, 564, 564.1, 564.2, 714, 729, 846, 29/890.033
See application file for complete search history.

(56) References Cited

U.S. PATENT DOCUMENTS

| 2,938,938 A | 5/1960 | Dickson, Jr. |
| 3,094,439 A | 6/1963 | Mann et al. |
| 3,116,171 A | 12/1963 | Nielsen et al. |
| 3,340,096 A | 9/1967 | Mann et al. |

(Continued)

FOREIGN PATENT DOCUMENTS

| DE | 32 38 187 A1 | 4/1984 |
| DE | 4030713 A1 | 4/1992 |

(Continued)

OTHER PUBLICATIONS

International Search Report dated Apr. 4, 2016 for the corresponding International Patent Application No. PCT/US2015/064116, 6 pages.

(Continued)

*Primary Examiner* — Thiem Phan
(74) *Attorney, Agent, or Firm* — Kilpatrick Townsend & Stockton LLP

(57) ABSTRACT

One embodiment of the present invention provides an apparatus for attaching conductive tabs to photovoltaic structures. The apparatus includes a cassette configured to store a plurality of conductive tabs and a pick-and-place apparatus configured to obtain a conductive tab from the cassette and place the conductive tab at an edge of a photovoltaic structure. The pick-and-place apparatus further includes a tab holder configured to pick up and release the conductive tab and a substantially horizontal track coupled to the tab holder. The tab holder is further configured to move back and forth along the track.

11 Claims, 17 Drawing Sheets

(56) References Cited

U.S. PATENT DOCUMENTS

| | | | |
|---|---|---|---|
| 3,375,141 A | 3/1968 | Julius | |
| 3,459,597 A | 8/1969 | Baron | |
| 4,577,051 A | 3/1986 | Hartmann | |
| 4,652,693 A | 3/1987 | Bar-On | |
| 4,877,460 A | 10/1989 | Flödl | |
| 5,118,361 A | 6/1992 | Fraas et al. | |
| 5,178,685 A | 1/1993 | Borenstein et al. | |
| 6,232,545 B1 | 5/2001 | Samaras et al. | |
| 6,303,853 B1 | 10/2001 | Fraas et al. | |
| 6,441,297 B1 | 8/2002 | Keller et al. | |
| 6,538,193 B1 | 3/2003 | Fraas | |
| 6,620,645 B2 | 9/2003 | Chandra et al. | |
| 6,803,513 B2 | 10/2004 | Beemink et al. | |
| 6,841,728 B2 | 1/2005 | Jones et al. | |
| 7,328,534 B2 | 2/2008 | Dinwoodie | |
| 7,388,146 B2 | 6/2008 | Fraas et al. | |
| 7,635,810 B2 | 12/2009 | Luch | |
| 7,749,883 B2 | 7/2010 | Meeus | |
| 7,772,484 B2 | 8/2010 | Li et al. | |
| 7,777,128 B2 | 8/2010 | Montello et al. | |
| 7,825,329 B2 | 11/2010 | Basol | |
| 7,829,781 B2 | 11/2010 | Montello et al. | |
| 7,829,785 B2 | 11/2010 | Basol | |
| 7,872,192 B1 | 1/2011 | Fraas et al. | |
| 7,872,193 B2 | 1/2011 | Ogawa et al. | |
| 8,052,036 B2 | 11/2011 | Chikaki | |
| 8,076,568 B2 | 12/2011 | Luch et al. | |
| 8,168,880 B2 | 5/2012 | Jacobs | |
| 8,196,798 B2 | 6/2012 | Luechinger et al. | |
| 8,209,920 B2 | 7/2012 | Krause et al. | |
| 8,222,513 B2 | 7/2012 | Luch | |
| 8,227,723 B2 * | 7/2012 | Benson | B23K 1/0016 |
| | | | 219/79 |
| 8,343,795 B2 | 1/2013 | Luo et al. | |
| 8,586,857 B2 | 11/2013 | Everson et al. | |
| 8,912,429 B2 | 12/2014 | Wudu | |
| 2003/0000571 A1 | 1/2003 | Wakuda et al. | |
| 2003/0121228 A1 | 7/2003 | Stoehr et al. | |
| 2003/0201007 A1 | 10/2003 | Fraas et al. | |
| 2005/0257823 A1 | 11/2005 | Zwanenburg | |
| 2007/0283997 A1 | 12/2007 | Hachtmann et al. | |
| 2007/0294883 A1 | 12/2007 | Napetschnig | |
| 2009/0255565 A1 | 10/2009 | Britt et al. | |
| 2010/0037932 A1 | 2/2010 | Erez et al. | |
| 2010/0043863 A1 | 2/2010 | Wudu et al. | |
| 2010/0147364 A1 | 6/2010 | Gonzalez et al. | |
| 2010/0193014 A1 | 8/2010 | Johnson et al. | |
| 2010/0218799 A1 | 9/2010 | Stefani | |
| 2010/0218805 A1 * | 9/2010 | Everett | H01L 31/02168 |
| | | | 136/246 |
| 2010/0224230 A1 | 9/2010 | Luch et al. | |
| 2011/0156188 A1 | 6/2011 | Tu et al. | |
| 2011/0239450 A1 | 10/2011 | Basol et al. | |
| 2011/0259419 A1 | 10/2011 | Hagemann et al. | |
| 2012/0000502 A1 | 1/2012 | Wiedeman et al. | |
| 2012/0040487 A1 | 2/2012 | Asthana et al. | |
| 2012/0060911 A1 | 3/2012 | Fu et al. | |
| 2012/0125391 A1 | 5/2012 | Pinarbasi et al. | |
| 2012/0152349 A1 | 6/2012 | Cao et al. | |
| 2012/0240995 A1 | 9/2012 | Coakley | |
| 2012/0248497 A1 | 10/2012 | Zhou et al. | |
| 2012/0279548 A1 | 11/2012 | Münch et al. | |
| 2012/0318319 A1 | 12/2012 | Pinarbasi et al. | |
| 2012/0325282 A1 | 12/2012 | Snow et al. | |
| 2013/0096710 A1 | 4/2013 | Pinarbasi et al. | |
| 2013/0152996 A1 | 6/2013 | DeGroot et al. | |
| 2013/0167910 A1 | 7/2013 | DeGroot et al. | |
| 2013/0206221 A1 | 8/2013 | Gannon et al. | |
| 2014/0124013 A1 | 5/2014 | Morad et al. | |
| 2014/0124014 A1 | 5/2014 | Morad et al. | |
| 2014/0373892 A1 | 12/2014 | Bergmann et al. | |
| 2015/0090314 A1 | 4/2015 | Yang et al. | |
| 2015/0270410 A1 | 9/2015 | Heng et al. | |
| 2015/0349145 A1 | 12/2015 | Morad et al. | |
| 2015/0349153 A1 | 12/2015 | Morad et al. | |
| 2015/0349161 A1 | 12/2015 | Morad et al. | |
| 2015/0349162 A1 | 12/2015 | Morad et al. | |
| 2015/0349167 A1 | 12/2015 | Morad et al. | |
| 2015/0349168 A1 | 12/2015 | Morad et al. | |
| 2015/0349169 A1 | 12/2015 | Morad et al. | |
| 2015/0349170 A1 | 12/2015 | Morad et al. | |
| 2015/0349171 A1 | 12/2015 | Morad et al. | |
| 2015/0349172 A1 | 12/2015 | Morad et al. | |
| 2015/0349173 A1 | 12/2015 | Morad et al. | |
| 2015/0349174 A1 | 12/2015 | Morad et al. | |
| 2015/0349175 A1 | 12/2015 | Morad et al. | |
| 2015/0349176 A1 | 12/2015 | Morad et al. | |
| 2015/0349190 A1 | 12/2015 | Morad et al. | |
| 2015/0349193 A1 | 12/2015 | Morad et al. | |
| 2015/0349701 A1 | 12/2015 | Morad et al. | |
| 2015/0349702 A1 | 12/2015 | Morad et al. | |
| 2015/0349703 A1 | 12/2015 | Morad et al. | |

FOREIGN PATENT DOCUMENTS

| | | |
|---|---|---|
| DE | 10 2012 003455 A1 | 8/2013 |
| EP | 1 205 982 A2 | 5/2002 |
| EP | 2 362 430 A1 | 8/2011 |
| EP | 2 521 190 A1 | 11/2012 |
| KR | 2010 0064698 A | 6/2010 |
| KR | 101 396 151 B1 | 5/2014 |
| WO | 1996017387 A1 | 6/1996 |
| WO | 2003/098704 A1 | 11/2003 |
| WO | 200089657 A1 | 7/2008 |
| WO | 2013020590 A1 | 2/2013 |
| WO | 2014074826 A2 | 5/2014 |
| WO | 2014124495 A1 | 8/2014 |

OTHER PUBLICATIONS

Written Opinion dated Apr. 4, 2016 for the corresponding International Patent Application No. PCT/US2015/064116, 7 pages.

Nowlan, M.J. et al., "Advanced Automation Techniques for Interconnecting Thin Silicon Solar Cells," IEEE First World Conference on Photovoltaic Energy Conversion, Waikoloa, Hawaii, Dec. 5-9, 1994, vol. CONF 1, Dec. 5, 1994, XP000681346, pp. 828-831.

* cited by examiner

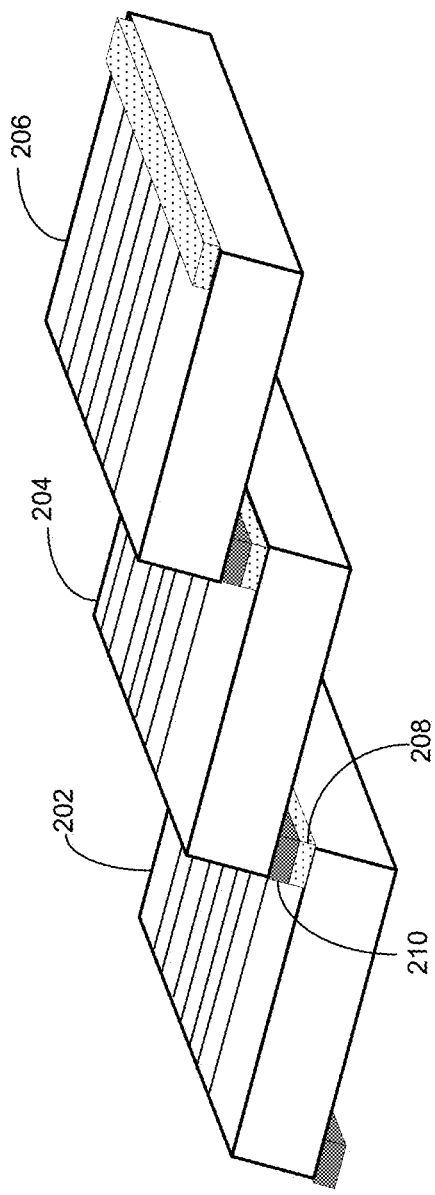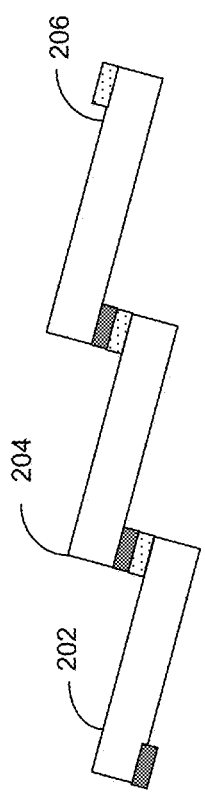
FIG. 2A
FIG. 2B

700

700

1006

1006

1006

SYSTEM AND APPARATUS FOR PRECISION AUTOMATION OF TAB ATTACHMENT FOR FABRICATIONS OF SOLAR PANELS

CROSS-REFERENCE TO OTHER APPLICATIONS

This claims the benefit of U.S. Provisional Patent Application No. 62/088,509, entitled "SYSTEM, METHOD, AND APPARATUS FOR AUTOMATIC MANUFACTURING OF SOLAR PANELS," filed Dec. 5, 2014; and U.S. Provisional Patent Application No. 62/143,694, entitled "SYSTEMS AND METHODS FOR PRECISION AUTOMATION OF MANUFACTURING SOLAR PANELS," filed Apr. 6, 2015; the disclosures of which are incorporated herein by reference in their entirety for all purposes.

This is also related to U.S. patent application Ser. No. 14/563,867, entitled "HIGH EFFICIENCY SOLAR PANEL," filed Dec. 8, 2014; and U.S. patent application Ser. No. 14/510,008, entitled "MODULE FABRICATION OF SOLAR CELLS WITH LOW RESISTIVITY ELECTRODES," filed Oct. 8, 2014; the disclosures of which are incorporated herein by reference in their entirety for all purposes.

FIELD OF THE INVENTION

This relates to the fabrication of solar panels. More specifically, this is related to an automated system that attaches tabs at the end of photovoltaic strings to enable single-sided inter-string electrical connections.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of a strip may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a string.

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Advances in photovoltaic technology, which are used to make solar panels, have helped solar energy gain mass appeal among those wishing to reduce their carbon footprint and decrease their monthly energy costs. However, the panels are typically fabricated manually, which is a time-consuming and error-prone process that makes it costly to mass-produce reliable solar panels.

Solar panels typically include one or more strings of complete photovoltaic structures. Adjacent photovoltaic structures in a string may overlap one another in a cascading arrangement. For example, continuous strings of photovoltaic structures that form a solar panel are described in U.S. patent application Ser. No. 14/510,008, filed Oct. 8, 2014 and entitled "Module Fabrication of Solar Cells with Low Resistivity Electrodes," the disclosure of which is incorporated herein by reference in its entirety. Producing solar panels with a cascaded cell arrangement can reduce the resistance due to inter-connections between the strips, and can increase the number of photovoltaic structures that can fit into a solar panel.

One method of making such a panel includes sequentially connecting the busbars of adjacent cells and combining them. One type of panel (as described in the above-noted patent application) includes a series of cascaded strips created by dividing complete photovoltaic structures into strips, and then cascading the strips to form one or more strings. Moreover, multiple individual strings are interconnected, assembled, and packaged together to form a solar panel. When strings are packaged into a panel, in addition to the energy conversion efficiency of each individual strip, the ways strings are electrically interconnected within a solar panel also determine the total amount of energy that can be extracted from each panel. It has been shown that solar panels based on parallelly connected cascaded strings provide several advantages, including but not limited to: reduced shading, enablement of bifacial operation, and reduced internal resistance. However, conventional approaches for inter-string connections often require cumbersome wirings, which only complicate the panel manufacturing process but can also lead to extra shading.

SUMMARY

One embodiment of the present invention provides an apparatus for attaching conductive tabs to photovoltaic structures. The apparatus includes a cassette configured to store a plurality of conductive tabs and a pick-and-place apparatus configured to obtain a conductive tab from the cassette and place the conductive tab at an edge of a photovoltaic structure. The pick-and-place apparatus further includes a tab holder configured to obtain and release the conductive tab and a track coupled to the tab holder. The tab holder is further configured to move back and forth along the track.

In a variation on this embodiment, the pick-and-place apparatus further include a substantially vertical expander couple to the tab holder, and the expander is configured to move the tab holder in a direction that intersects with the track.

In a further variation, the expander further includes a translation stage driven by a step motor.

In a further variation, the track further includes an attachment mechanism configured to attach the vertical expander to the track and an actuation mechanism configured to accurate the attachment mechanism back and forth along the track.

In a variation on this embodiment, the conductive tabs are stacked vertically in the cassette, and the cassette further includes a stack-elevating mechanism configured to push up the stack of tabs subsequent to the conductive tab before the conductive tab is placed.

In a further variation, the elevating mechanism includes a compression spring.

In a variation on this embodiment, the tab holder includes at least one suction cup.

In a variation on this embodiment, the apparatus further includes a conveyor controller configured to control movements of a conveyor carrying the photovoltaic structure along a path substantially perpendicular to the track, thereby facilitating aligning the edge of the photovoltaic structure to the tab holder.

In a variation on this embodiment, the photovoltaic structure includes a busbar that is substantially along the edge, and the pick-and-place apparatus is configured to place the conductive tab over the busbar.

In a variation on this embodiment, the conductive tab is selected from a group consisting: a metallic tab, a conductive non-metallic tab, and a conductive core partially covered by an insulation layer.

BRIEF DESCRIPTION OF THE FIGURES

FIG. 2A shows a string of cascaded strips, according to an embodiment of the invention.

FIG. 2B shows a side view of the string of cascaded strips, according to one embodiment of the invention.

In the figures, like reference numerals refer to the same figure elements.

DETAILED DESCRIPTION

Figure 1A:
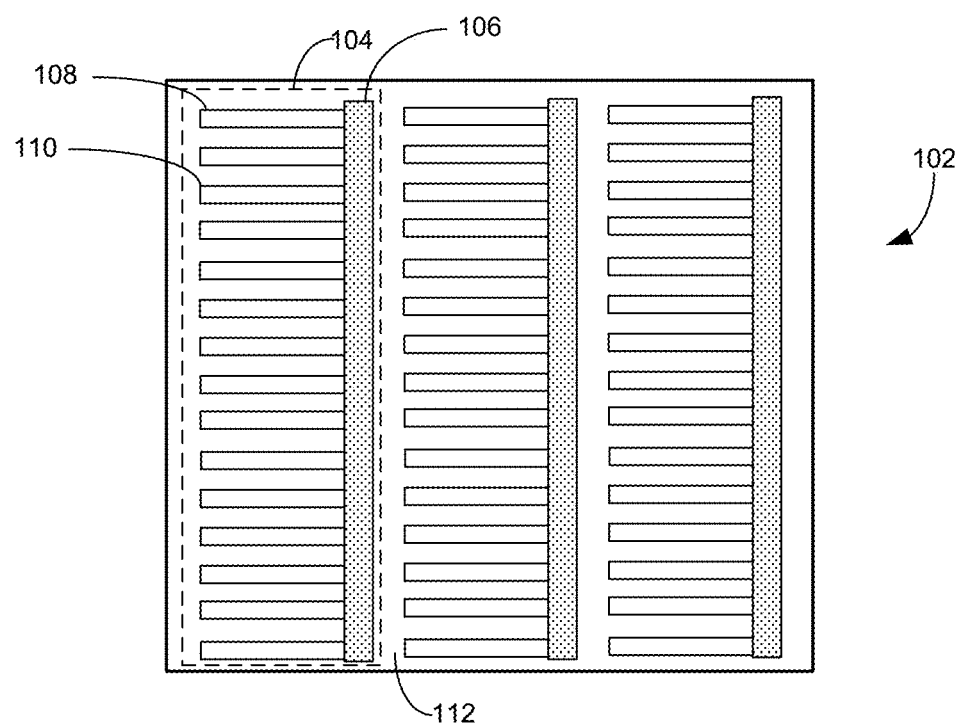
FIG. 1A shows an exemplary grid pattern on the front surface of a photovoltaic structure, according to one embodiment of the present invention.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

A tabbing system is provided to solve the technical problem of automatically attaching conductive tabs to ends of solar strings to facilitate inter-string connections. The tabbing system operates within an automated assembly line that can fabricate complete solar panels, which may include photovoltaic structure strips arranged in a cascaded configuration. The tabbing system can receive a string on a conveyor, and can attach a conductive tab to an end, which can be the end that has an exposed busbar, of the string.

More specifically, the automated tabbing system can include a tab cassette and a tab pick-and-place apparatus. The tab cassette can hold the to-be-attached tabs and can include an elevating mechanism that can automatically push up the tab stack after the removal of a tab. The tab pick-and-place apparatus can pick up a tab from the tab cassette and can place the tab at a desired location. For example, the tab can be placed in such a way that part of the tab can be on top of the end busbar and the other part of the tab suspends in the air. Prior to the tab placement, conductive paste can be applied onto the end busbar, thus facilitating the bonding (electrical and mechanical) between the tab and the end busbar. As a result, when viewing from the bottom side (the side opposite to the side of the exposed end busbar), the tab may be partially exposed (the unexposed part may be in contact with the end busbar), thus allowing electrical coupling to the exposed portion. In other words, attaching a conductive tab at the string end can reverse the orientation (e.g., from facing up to facing down) of the exposed conductive surface at that end, making it possible to obtain electrical connections to both ends (hence both polarity) the string from the same side.

During fabrication, photovoltaic structures comprising multi-layer semiconductor structures may first be fabricated using crystalline silicon wafers. In some embodiments, the multi-layer semiconductor structure can include a double-sided tunneling heterojunction photovoltaic structure. The photovoltaic structures can be based on 5-inch or 6-inch wafers and have the shape of a square or pseudo square with chamfered corners. In some embodiments, the photovoltaic structures may be 6×6 inch square-shaped cells. Subsequently, front- and back-side conductive grids may be deposited on the front and back surfaces of the photovoltaic structures respectively to complete the bifacial photovoltaic structure fabrication (see FIGS. 1A and 1B).

In some embodiments, depositing the front- and back-side conductive grids may include electroplating of a Cu grid, which may be subsequently coated with Ag or Sn. In other embodiments, one or more seed metallic layers, such as a seed Cu or Ni layer, can be deposited onto the multi-layer structures using a physical vapor deposition (PVD) technique to improve adhesion and ohmic contact quality of the electroplated Cu layer. Different types of conductive grids can be formed, including, but not limited to: a grid with a single busbar at the center and a grid with a single busbar at the cell edge. In the "edge-busbar" configuration, the busbars at the front and back surfaces of the multi-layer structure may be placed at opposite edges, respectively.

Solar Panel Based on Cascaded Strips

Some conventional solar panels include a single string of serially connected standard-size, undivided photovoltaic structures. As described in U.S. patent application Ser. No. 14/563,867, it can be more desirable to have multiple (such as 3) strings, each string including cascaded strips, and connect these strings in parallel. Such a multiple-parallel-string panel configuration provides the same output voltage with a reduced internal resistance. In general, a cell can be divided into n strips, and a panel can contain n strings, each string having the same number of strips as the number of regular photovoltaic structures in a conventional single-string panel. Such a configuration can ensure that each string outputs approximately the same voltage as a conventional panel. The n strings can then be connected in parallel to form a panel. As a result, the panel's voltage output can be the same as that of the conventional single-string panel, while the panel's total internal resistance can be 1/n of the resistance of a string (note that the total resistance of a string made of a number of strips can be a fraction of the total resistance of a string made of the same number of undivided cells). Therefore, in general, the greater n is, the lower the total internal resistance of the panel is, and the more power one can extract from the panel. However, a tradeoff is that as n increases, the number of connections required to inter-connect the strings also increases, which increases the amount of contact resistance. Also, the greater n is, the more strips a single cell needs to be divided into, which increases the associated production cost and decreases overall reliability due to the larger number of strips used in a single panel.

Another consideration in determining n is the contact resistance between the electrode and the photovoltaic structure on which the electrode is formed. The greater this contact resistance is, the greater n might need to be to reduce effectively the panel's overall internal resistance. Hence, for a particular type of electrode, different values of n might be needed to attain sufficient benefit in reduced total panel internal resistance to offset the increased production cost and reduced reliability. For example, conventional silver-paste or aluminum based electrode may require n to be greater than 4, because process of screen printing and firing silver paste onto a cell does not produce ideal resistance between the electrode and underlying photovoltaic structure. In some embodiments of the present invention, the electrodes, including both the busbars and finger lines, can be fabricated using a combination of physical vapor deposition (PVD) and electroplating of copper as an electrode material. The resulting copper electrode can exhibit lower resistance than an aluminum or screen-printed-silver-paste electrode. Consequently, a smaller n can be used to attain the benefit of reduced panel internal resistance. In some embodiments, n is selected to be three, which is less than the n value generally needed for cells with silver-paste electrodes or other types of electrodes. Correspondingly, two grooves can be scribed on a single cell to allow the cell to be divided to three strips.

In addition to lower contact resistance, electro-plated copper electrodes can also offer better tolerance to micro cracks, which may occur during a cleaving process. Such micro cracks might adversely impact silver-paste-electrode cells. Plated-copper electrode, on the other hand, can preserve the conductivity across the cell surface even if there are micro cracks in the photovoltaic structure. The copper electrode's higher tolerance for micro cracks allows one to use thinner silicon wafers to manufacture cells. As a result, the grooves to be scribed on a cell can be shallower than the grooves scribed on a thicker wafer, which in turn helps increase the throughput of the scribing process. More details on using copper plating to form low-resistance electrode on a photovoltaic structure are provided in U.S. patent application Ser. No. 13/220,532, entitled "SOLAR CELL WITH ELECTROPLATED GRID," filed Aug. 29, 2011, the disclosure of which is incorporated herein by reference in its entirety.

FIG. 1A shows an exemplary grid pattern on the front surface of a photovoltaic structure, according to one embodiment of the present invention. In the example shown in FIG. 1A, grid 102 includes three sub-grids, such as sub-grid 104. This three sub-grid configuration allows the photovoltaic structure to be divided into three strips. To enable cascading, each sub-grid needs to have an edge busbar. In the example shown in FIG. 1A, each sub-grid includes an edge busbar ("edge" here refers to the edge of a respective strip) running along the longer edge of the corresponding strip and a plurality of parallel finger lines running in a direction parallel to the shorter edge of the strip. For example, sub-grid 104 includes edge busbar 106, and a plurality of finger lines, such as finger lines 108 and 110. To facilitate the subsequent laser-assisted scribe-and-cleave process, a predefined blank space (i.e., space not covered by electrodes) can be inserted between the adjacent sub-grids. For example, blank space 112 is defined to separate sub-grid 104 from its adjacent sub-grid. In some embodiments, the width of the blank space, such as blank space 112, can be between 0.1 mm and 5 mm, preferably between 0.5 mm and 2 mm. There is a tradeoff between a wider space that leads to more tolerant scribing operation and a narrower space that leads to more effective current collection. In a further embodiment, the width of such a blank space can be approximately 1 mm.

Figure 1B:
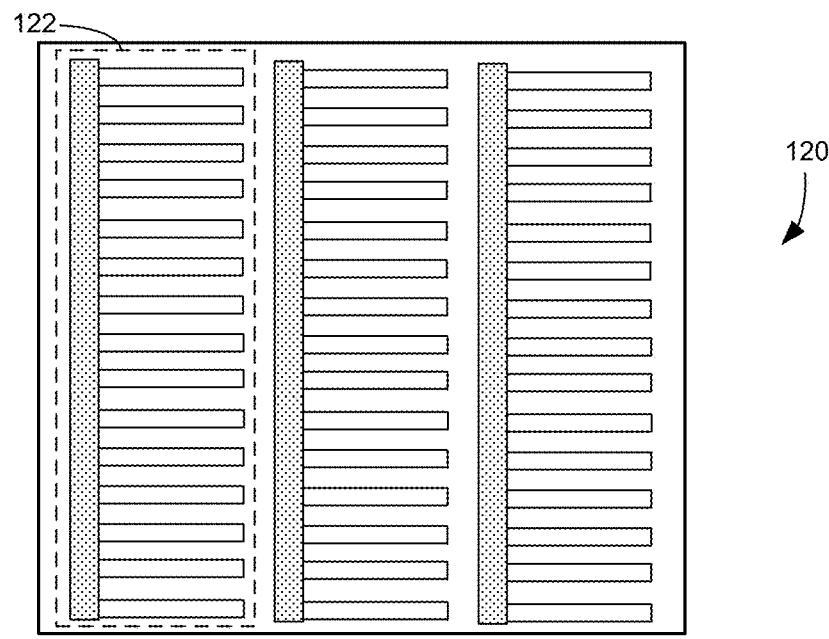
FIG. 1B shows an exemplary grid pattern on the back surface of a photovoltaic structure, according to one embodiment of the invention.

FIG. 1B shows an exemplary grid pattern on the back surface of a photovoltaic structure, according to one embodiment of the invention. In the example shown in FIG. 1B, back grid 120 includes three sub-grids, such as sub-grid 122. To enable cascaded and bifacial operation, the back sub-grid needs to correspond to the frontside sub-grid. More specifically, the back edge busbar needs to be located at the opposite edge of the frontside edge busbar. In the examples shown in FIGS. 1A and 1B, the front and back sub-grids have similar patterns except that the front and back edge busbars are located adjacent to opposite edges of the strip. In addition, locations of the blank spaces in back metal grid 120 correspond to locations of the blank spaces in front metal grid 102, such that the grid lines do not interfere with the subsequent scribe-and-cleave process. In practice, the finger line patterns on the front- and back-side of the photovoltaic structure may be the same or different.

In the examples shown in FIGS. 1A and 1B, the finger line patterns can include continuous, non-broken loops. For example, as shown in FIG. 1A, finger lines 108 and 110 both include connected loops with rounded corners. This type of "looped" finger line pattern can reduce the likelihood of the finger lines from peeling away from the photovoltaic structure after a long period of usage. Optionally, the sections where parallel lines are joined can be wider than the rest of the finger lines to provide more durability and prevent peeling. Patterns other than the one shown in FIGS. 1A and 1B, such as un-looped straight lines or loops with different shapes, are also possible.

To form a cascaded string, strips (as a result of a scribing and cleaving process applied to a regular square-shaped cell) can be cascaded with their edges overlapped. FIG. 2A shows a string of cascaded strips, according to an embodiment of the invention. In FIG. 2A, strips 202, 204, and 206 are stacked in such a way that strip 206 partially overlaps adjacent strip 204, which also partially overlaps (on an opposite edge) strip 202. Such a string of strips forms a pattern that is similar to roof shingles. Each strip includes top and bottom edge busbars located at opposite edges of the top and bottom surfaces, respectively. Strips 202 and 204 are coupled to each other via an edge busbar 208 located at the top surface of strip 202 and an edge busbar 210 located at the bottom surface of strip 204. To establish electrical coupling, strips 202 and 204 are placed in such a way that bottom edge busbar 210 can be placed on top of and in direct contact with top edge busbar 208.

FIG. 2B shows a side view of the string of cascaded strips, according to one embodiment of the invention. In the example shown in FIGS. 2A and 2B, the strips can be part of a 6-inch square-shaped photovoltaic structure, with each strip having a dimension of approximately 2 inches by 6 inches. To reduce shading, the overlapping between adjacent strips should be kept as small as possible. In some embodiments, the single busbars (both at the top and the bottom surfaces) are placed at the very edge of the strip (as shown in FIGS. 2A and 2B). The same cascaded pattern can extend along an entire row of strips to form a serially connected string.

From FIGS. 2A and 2B one can see that, other than at both ends of a string, all busbars are sandwiched between the overlapped strips. This no-busbar configuration reduces shading. In addition, one can see that a string can be connected to a different string via busbars at either ends. However, because the busbars are facing different sides (one faces the top and the other faces the bottom) of the string, connecting the strings may sometimes require flipping over a string of cascaded strips, which is not an easy task considering that a string may include tens of cascaded strips made of thin semiconductor wafers.

Cascaded String with Attached Conductive Tab

The fabrication of a solar panel can typically involve encapsulating photovoltaic structures between front and back covers made of protective materials. The light-facing side of the panel can often include a glass cover, and the side facing away from the light can often include a non-transparent cover, known as the backsheet. Typical backsheets for solar panels are made of polyvinyl fluoride (PVF) or polyethylene terephthalate (PET) films, which are electrical insulating. Alternatively, a solar panel backsheet may include a conductive interlayer sandwiched between layers of insulating materials. The conductive interlayer can include a metallic interlayer, such as an aluminum (Al) interlayer or a copper (Cu) interlayer.

Figure 3:
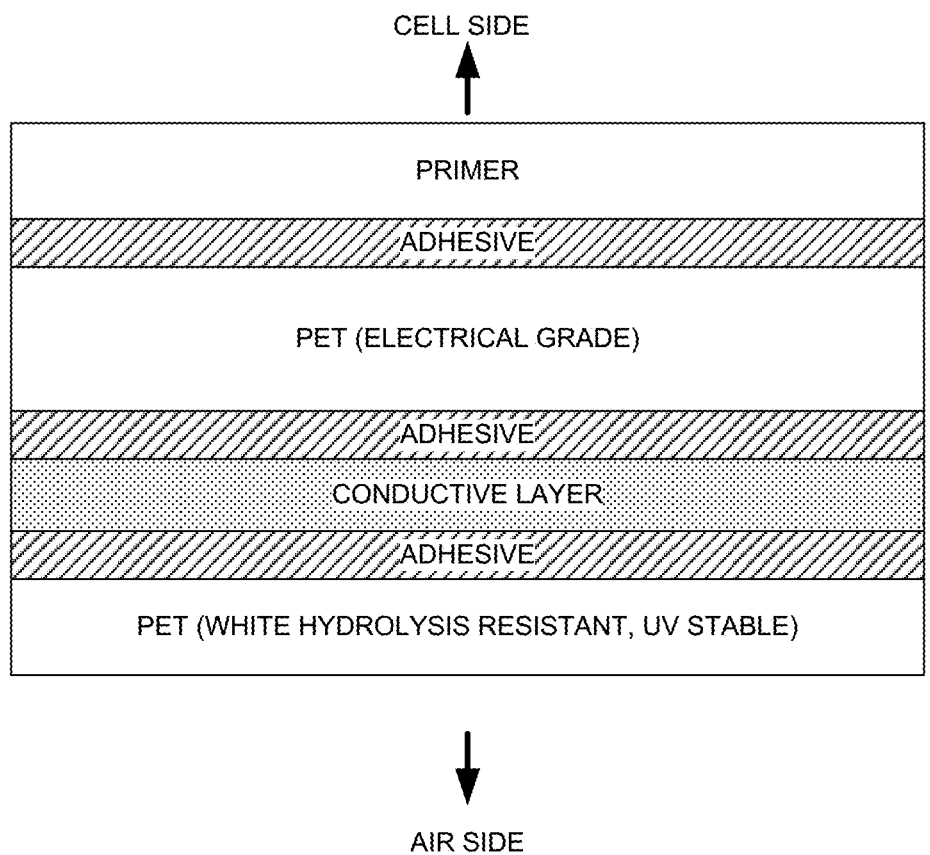
FIG. 3 shows the structure of an exemplary backsheet with a conductive interlayer.

FIG. 3 shows the structure of an exemplary backsheet with a conductive interlayer. In FIG. 3, backsheet 300 includes a plurality of layers, including a primer layer facing the photovoltaic structures, an electrical-grade PET layer, an adhesive layer between the primer layer and the electrical-grade PET layer, a conductive layer, an adhesive layer between the conductive layer and the electrical-grade PET layer, another PET layer that is hydrolysis resistant and UV stable, and an adhesive layer between the conductive layer and the hydrolysis-resistant PET layer. The outer PET layers can provide excellent electrical insulation, which can be essential to protect the photovoltaic structures from being exposed to external voltage. In addition to PET, other insulating materials, such as PVF, Polyamide, and Tedlar® (registered trademark of E. I. du Pont de Nemours and Company of Wilmington, Del.), may also be used as outer layers that encapsulate the metal interlayer.

The existence of a conductive interlayer in the backsheet provides a possibility of achieving inter-string electrical coupling from one side of the string. More specifically, conductive paths among strings can be established through the conductive interlayer. To do so, one needs to first establish a conductive path between the end busbar of a string and the conductive interlayer. Establishing a conductive path between the end busbar that can be located at the bottom side (the side facing the backsheet) of the string and the conductive interlayer can be relatively simple as long as one can bypass the insulating material situated between the string and conductive interlayer. One can create vias in the insulation material and fill such vias with a conductive material, such as certain type of conductive paste, to establish the electrical connection. On the other hand, establishing a conductive path between the end busbar that is located at the top side of a string and the conductive interlayer can be challenging because of the lack of a straight path between the top busbar and the conductive interlayer.

One approach for establishing electrical connections to the top busbar from the bottom side of a photovoltaic structure is to drill holes through the photovoltaic structure itself. Similar approaches have been used in fabrications of emitter warp through (EWT) or metallization wrap through (MWT) solar cells. However, such an approach can lead to a much more complex fabrication process. To solve this problem, in some embodiments, a tabbing machine can be used to attach a conductive tab to the end busbar that can be located at the top side of the string. In addition to be in contact with the top busbar, the conductive tab extends beyond the edge of the string to allow an electrical connection to be made to the tab from the bottom side of the string.

Figure 4:
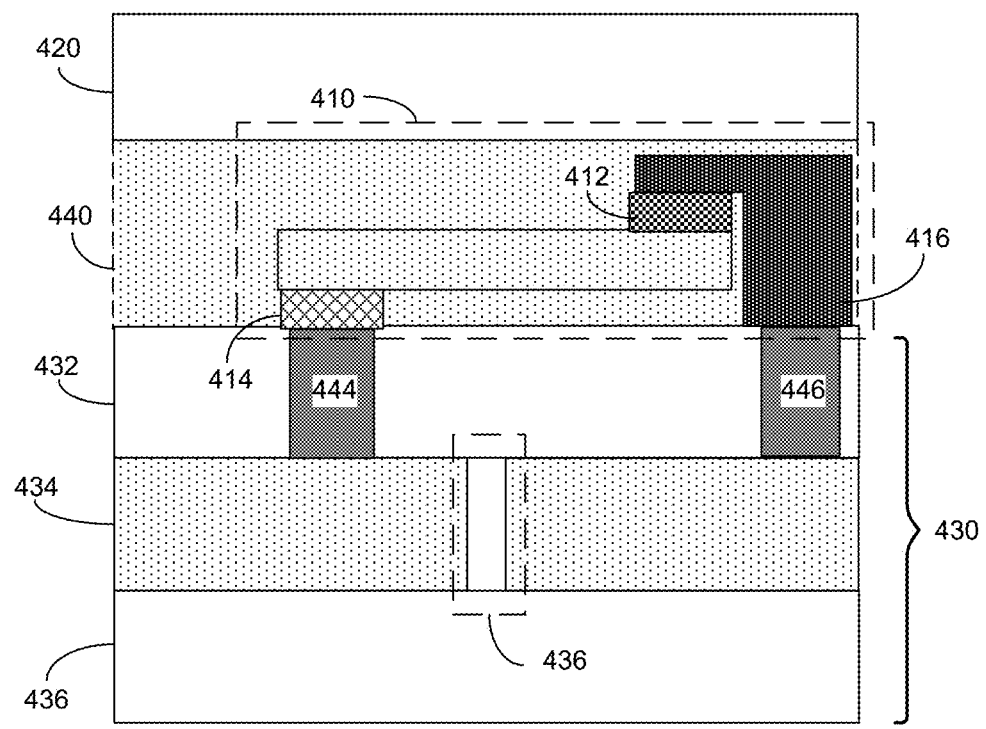
FIG. 4 shows exemplary electrical coupling between a string and the conductive interlayer in the backsheet, according to an embodiment of the present invention.

FIG. 4 shows exemplary electrical coupling between a string and the conductive interlayer in the backsheet, according to an embodiment of the present invention. In FIG. 4, string 410 is sandwiched between glass cover 420 and backsheet 430, and is optionally embedded in sealant layer 440, which can be part of backsheet 430. For simplicity, the individual strips within string 410 are not drawn in detail. One can refer to FIGS. 2A and 2B for details about how the strips are cascaded. In FIG. 4, string 410 includes a top end busbar 412 facing glass cover 420 and a bottom end busbar 414 facing backsheet 430. To facilitate electrical connection to top busbar 412 from the bottom side of string 410, conductive tab 416 can be attached to top busbar 412. More specifically, a portion of conductive tab 416 can be in contact with (or on top of) top busbar 412, and a portion of conductive tab 416 extends beyond the rightmost edge of string 410, and hence can be accessed from the bottom side of string 410.

Backsheet 430 can include top insulation layer 432, conductive interlayer 434, and bottom insulation layer 436. Vias 444 and 446 are created within top insulation layer 432, and are underneath bottom busbar 414 and conductive tab 416, respectively. Conductive materials, such as a conductive metallic core surrounded by a resin or a resin that includes a number of suspended conductive particles, can be used to fill vias 444 and 446. Consequently, conductive paths from conductive interlayer 434 to top and bottom busbars 412 and 414 can be established. A gap 436 can also be created within conductive interlayer 434 to electrically insulate a portion of conductive interlayer 434 coupled to busbar 412 from the portion coupled to busbar 414, thus preventing electrical shorting between the two polarities of string 410.

Figures 5A, 5B:
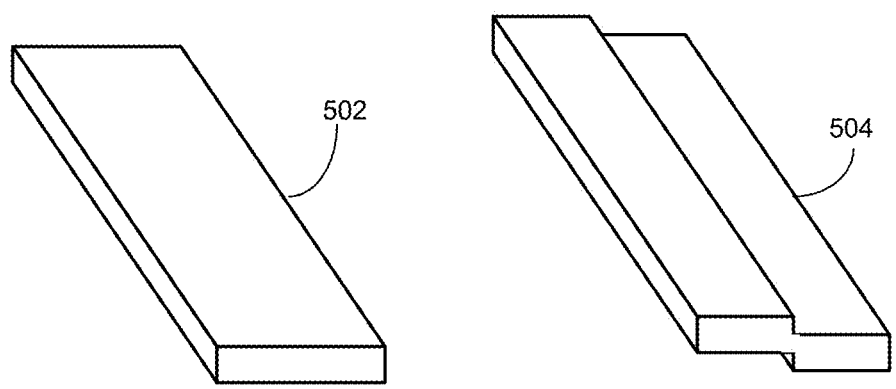
FIG. 5A shows an exemplary configuration of a conductive tab, according to an embodiment of the present invention.
FIG. 5B shows an exemplary configuration of a conductive tab, according to an embodiment of the present invention.

In the example shown in FIG. 4, for illustration purposes, conductive tab 416 is shown as "L" shaped with one section of the "L" in contact with top busbar 412 and the other section of the "L" in contact with the conductive material filled in via 446. In practice, conductive tab 416 may have different shapes or forms. FIG. 5A shows an exemplary configuration of a conductive tab, according to an embodiment of the present invention. In FIG. 5A, tab 502 can be a rectangular prism. When being attached to the end of a string, a portion of the bottom surface of tab 502 can be in contact with the end busbar, and the other portion of the bottom surface can be in contact with the conductive material filled in the corresponding via. Because the thickness of the string can be relatively small, such as a few hundreds of microns, it can be possible to use a flat tab to couple the top busbar and the via. In some embodiments, the width of tab 502 can be similar to the width (along the busbar direction) of the strips. For example, if the strips are made from square or pseudo square wafers of 6 inches by 6 inches, the width of tab 502 can be around 6 inches. In some embodiment, the width of the tab can be between 100 mm and 200 mm. The length of tab 502 can be between 5 mm and 10 mm, and the height of tab 502 can be between 200 microns and 1 mm. Thinner tabs can provide cost saving, whereas thicker tabs are easier to handle. Moreover, compared to L-shaped tabs, flat tabs are easier to handle and to place at desired locations.

FIG. 5B shows an exemplary configuration of a conductive tab, according to an embodiment of the present invention. In FIG. 5B, conductive tab 504 has a shape that may be similar to two-step stairs. When attached to a string, the top stair of tab 504 may be in contact with a end busbar at the top side of the string, and the bottom stair of tab 504 may be in contact with a via created within the top insulation layer of the backsheet. The dimensions of tab 504, including the length, width, and height (which is the thickness of each stair), can be similar to the dimensions of tab 502. To accommodate the thickness of the string, which can include the thickness of cascaded strips and the thickness of the busbars, the offset between the two stairs can be similar to the thickness of the string. In some embodiments, the offset can be between 200 and 500 microns.

In addition to the different shapes, the tabs may also include different materials, either conductive materials or insulating materials, other than pure metal. The conductive materials can include metallic materials, such as Ag, Cu, Ag/Cu alloy, and tin coated Ag or Cu; and non-metallic conductive materials, such as graphite and conductive polymers. The insulating material can be used to wrap a conductive core to prevent accidental shunting at the edge of the string. For tabs that are completely wrapped with an insulation layer, slots or holes can be created in the insulation layer to facilitate electrical connections to busbars and to vias in the backsheet. Alternatively, tabs can be partially wrapped with an insulation layer. For example, a tab can include a conductive core with its top surface and sidewalls covered by an insulation layer. In some embodiments, the tab can be partially wrapped with a EPE film layer, which may be a multi-layer film consisting of Vinyl Acetrate resin (EVA) bonded to both sides of a Polyester film. More pacifically, other than the string-facing surface that may be in contact with the busbar, the surface that faces away from the string and sidewalls of the tab can be completely covered by the EPE film. The EPE film can be chosen to be black to ensure consistence in appearance of the tabbed solar string.

Figure 6A:
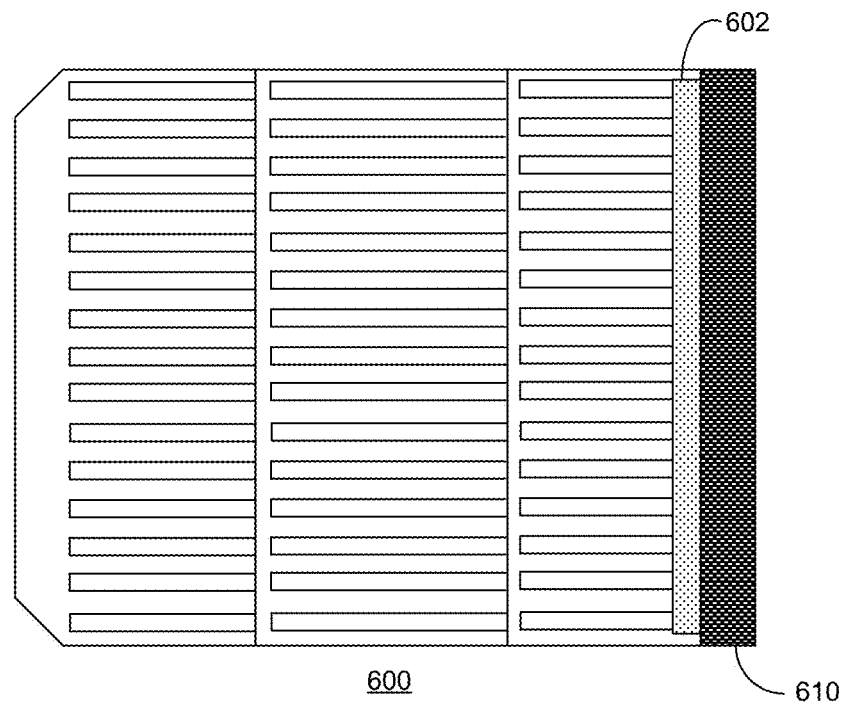
FIG. 6A shows the top view of a string unit that includes three strips, according to an embodiment of the present invention.

FIG. 6A shows the top view of a string unit that includes three strips, according to an embodiment of the present invention. The term "string unit" refers to a string that consists of strips obtained from a single original photovoltaic structure. A string unit is a basic building block of a longer string, which can typically include multiple string units. In the example shown in FIG. 6A, a pseudo-square wafer of a standard size can be cleaved into three strips, which are edge overlapped to form string unit 600. When viewed from the top, the only visible busbar is busbar 602 located at the right end of string unit 600. As discussed previously, other top busbars are covered by edges of adjacent strips. FIG. 6A also shows a conductive tab 610 partially covers busbar 602. It is also possible for conductive tab 610 to completely cover busbar 602. The direct contact between conductive tab 610 and busbar 602 establishes an electrical connection between them. In some embodiments, conductive adhesive has been applied on busbar 602 to bond busbar 602 to tab 610.

Figure 6B:
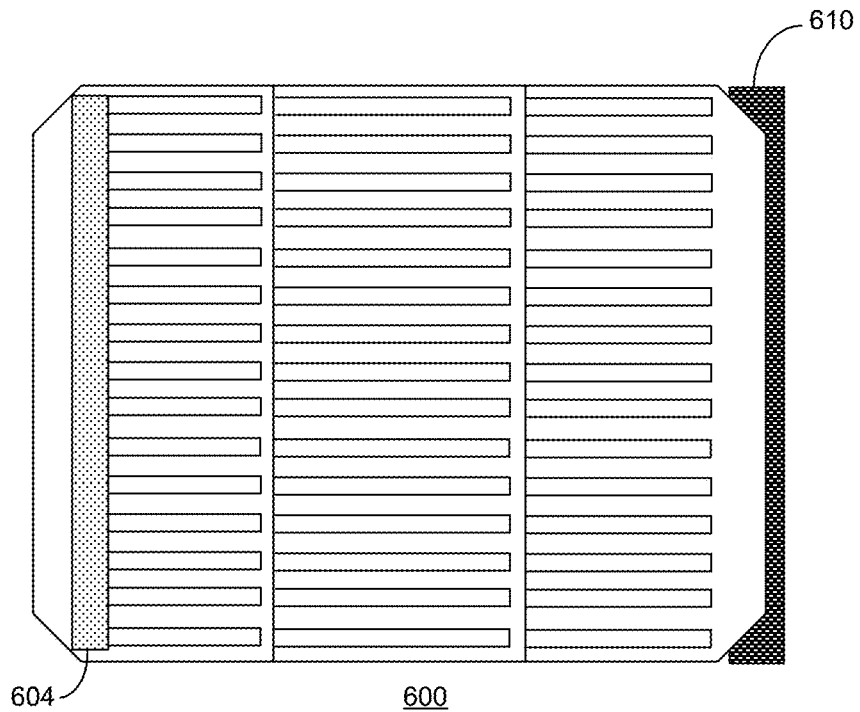
FIG. 6B shows the bottom view of a string unit that includes three strips, in accordance with an embodiment of the present invention.

FIG. 6B shows the bottom view of a string unit that includes three strips, in accordance with an embodiment of the present invention. As one can see from FIG. 6B, when viewed from the bottom, the only visible busbar on string unit 600 is bottom busbar 604 located at the left end of string unit 600. At the opposite (the right) end of string unit 600, conductive tab 610 extends beyond the edge of string unit 610, partially exposing the bottom surface of tab 610. The partially exposed bottom surface of tab 610 enables electrical access to top busbar 602 from the bottom side of string unit 600.

During the fabrication a solar panel, multiple string units can be assembled together to form a longer string. For example, multiple string units can be edge stacked in a similar way with one placed on top of an adjacent one to form a serially connected longer string. Other stacking patterns can also be possible. If multiple string units are similarly cascaded to form a longer string, the longer string will have only two exposed busbars at its opposite ends, and a conductive tab can be attached to one of the end busbars, making it possible to have electrical connections to both busbars from the same side of the longer string.

Figure 7A:
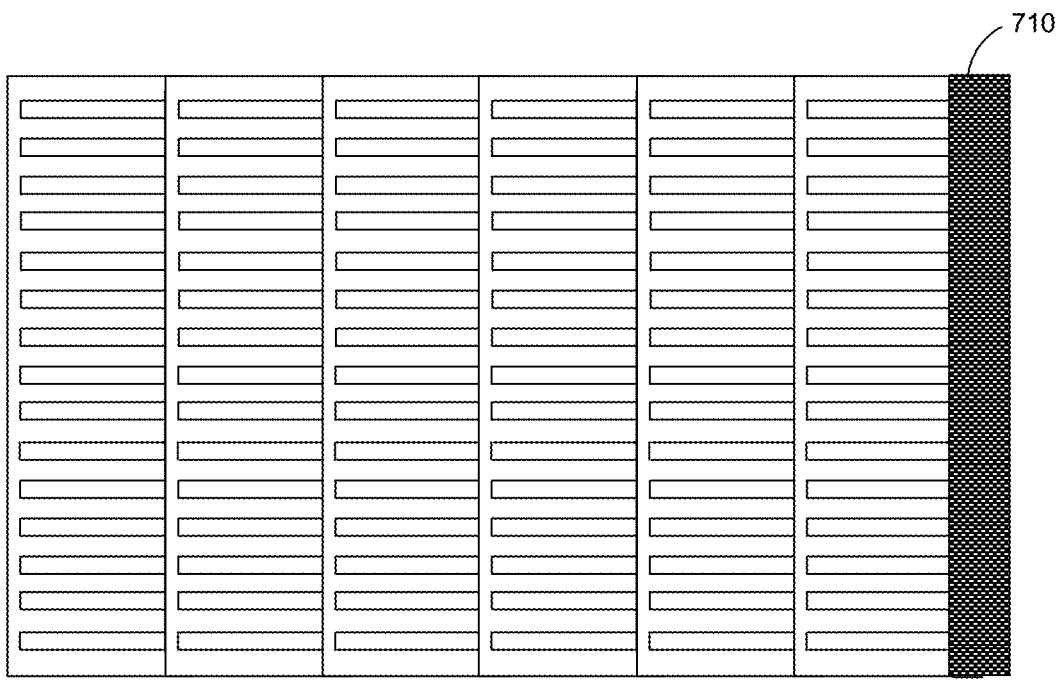
FIG. 7A shows the top view of a longer string, according to an embodiment of the present invention.
Figure 7B:
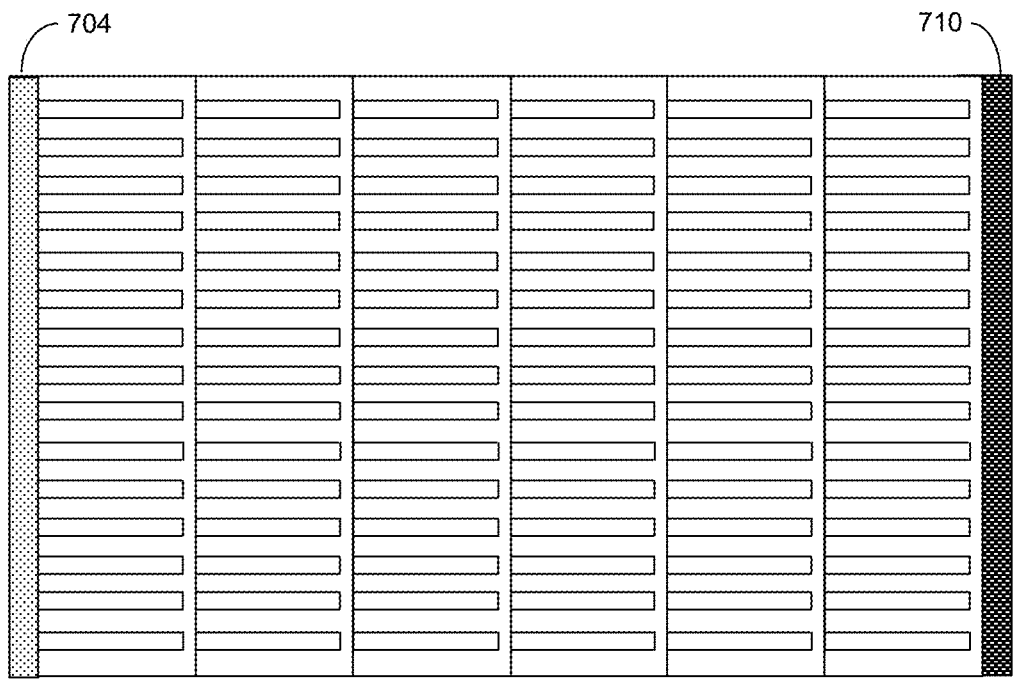
FIG. 7B presents a diagram illustrating the bottom view of a longer string, in accordance with an embodiment of the present invention.

FIG. 7A shows the top view of a longer string, according to an embodiment of the present invention. In this example, the original undivided wafers are squares. In FIG. 7A, longer string 700 includes multiple string units, each of which may includes multiple strips. A conductive tab 710 can be placed at the right end of longer string 700, completely covering a top busbar (not shown in FIG. 7A) located at the right end of loner string 700. FIG. 7B presents a diagram illustrating the bottom view of a longer string, in accordance with an embodiment of the present invention. From FIG. 7B, one can see that conductive tab 710 extends beyond the right edge of longer string 700. As a result, both bottom busbar 704 located at the opposite end and conductive tab 710 can be accessed from the bottom side of longer string 700. In other words, electrical coupling to both polarities of longer string 700 are achievable from one side.

Tabbing Machine

Attaching conductive tabs at ends of strings requires a high level of precision. Misaligned tabs may result in insufficient conductivity or undesired shortening. Moreover, the high-throughput panel fabrication also requires that such operation should be automated. In some embodiments, an automated, high-precision tabbing machine can be used to attach conductive tabs at the ends of strings.

Figure 8:
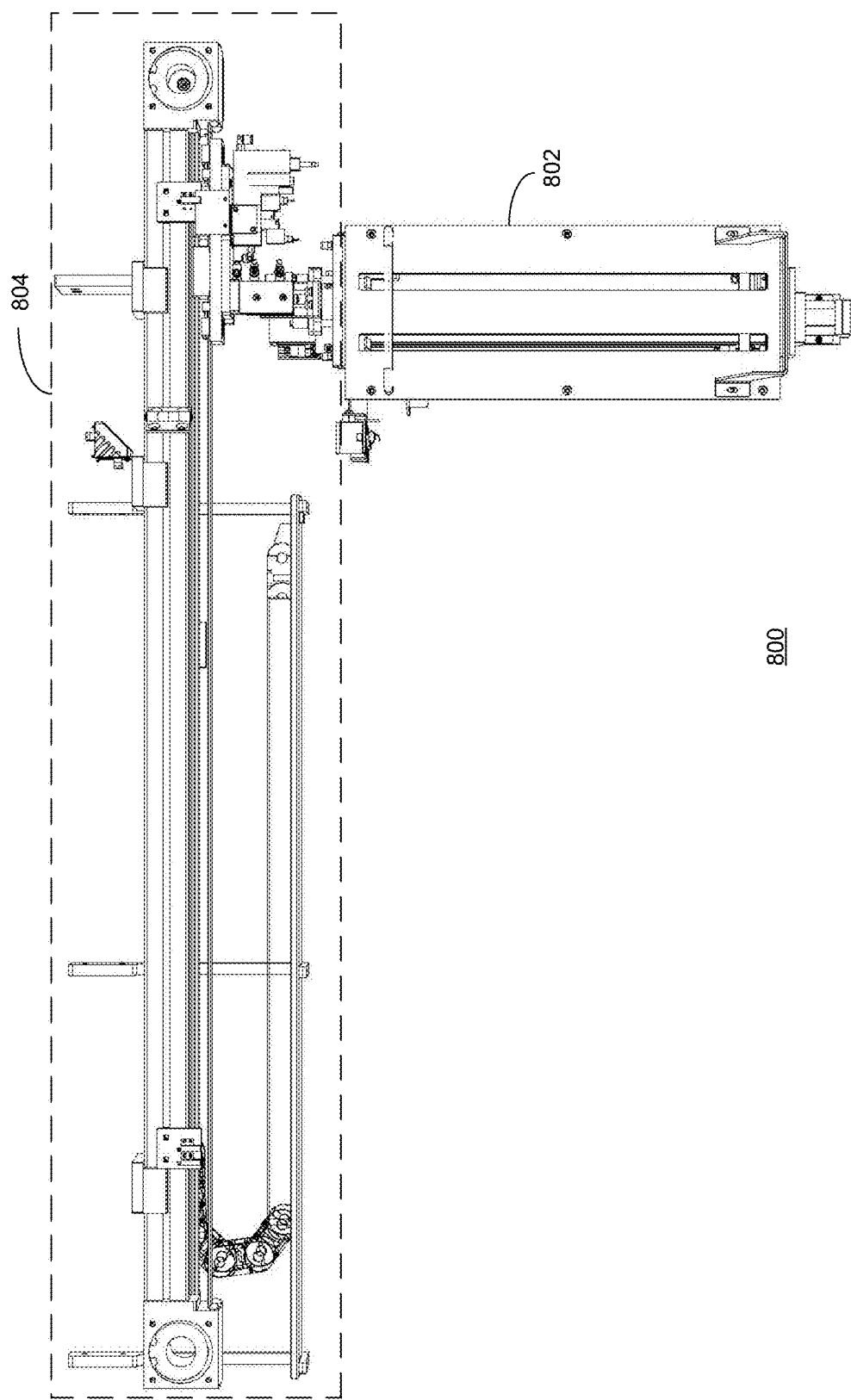
FIG. 8 shows the systematical view of an exemplary tabbing system, according to an embodiment of the present invention.

FIG. 8 shows the systematical view of an exemplary tabbing system, according to an embodiment of the present invention. More specifically, tabbing system 800 includes a tab cassette 802 and a pick-and-place apparatus 804. Tab cassette 802 stores the conductive tabs that are to be attached to the strings. In some embodiments, tabs can be stacked vertically one-by-one inside tab cassette 802, and are removed sequentially from the top. A stack elevation mechanism, such as a compression spring, can be included in tab cassette 802 to move up the tab stack while tabs are being removed from the top. In addition to spring loading, other loading mechanisms can also be used, to move the stack as the tabs being consumed. For example, the tabs may be removed from the bottom of the tab cassette, and gravity will automatically pulls down the tab stack while tabs are being removed. Tab cassette 802 can be designed to hold a large quantity of tabs, which can be hundreds, thereby reducing the need for frequent replacement of the tab cassette during the manufacture of the solar panels. In some embodiments, tab cassette 802 can be removable, and empty cassette can be replaced by another cassette filled with tabs. The replacement of tab cassette 802 can be performed by a human operator, or by an automated machine. Similarly, the operation of loading tabs into a tab cassette can also be performed by a human operator or by a specially designed machine. The time needed for replacing an empty tab cassette can be a few seconds or less, and the service disruption caused by replacing the cassette can be negligible.

Figure 9B:
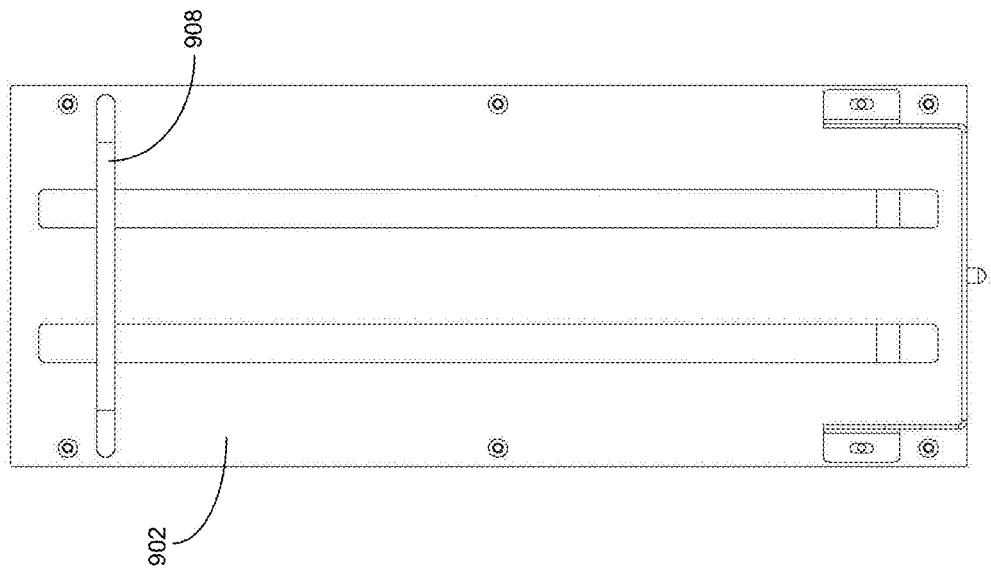
FIG. 9B shows the front view of the tab cassette, according to an embodiment of the present invention.
Figure 9A:
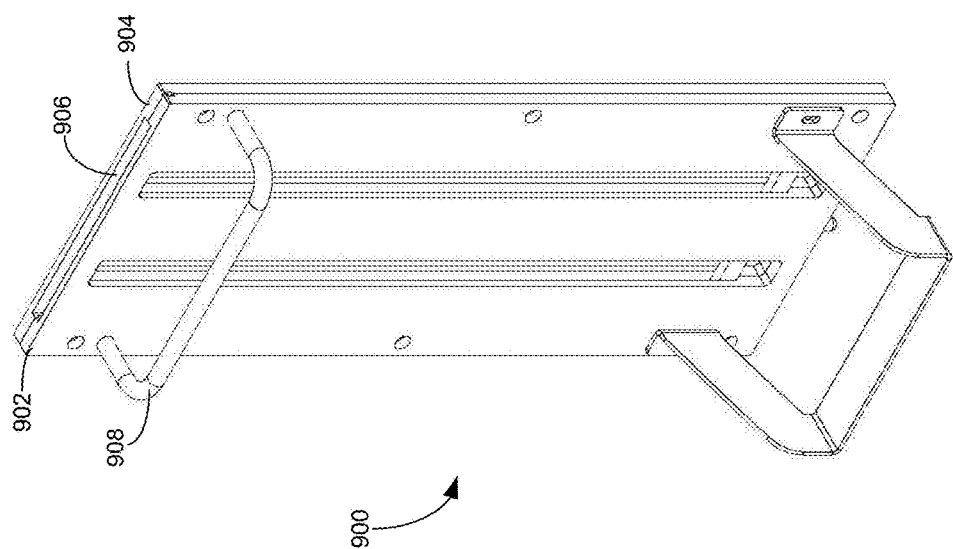
FIG. 9A shows the perspective view of an exemplary tab cassette, according to an embodiment of the present invention.

FIG. 9A shows the perspective view of an exemplary tab cassette, according to an embodiment of the present invention. As shown in FIG. 9A, tab cassette 900 includes front cover 902 and back cover 904. In the example shown in FIG. 9A, the cross sections of front cover 902 and back cover 904 are shaped like a "U," with ends of the one "U" in contact with ends of the other "U" to form enclosed space 906 that holds the stack of tabs. The top opening of enclosed space 906 can allow tabs to be picked up by the pick-and-place apparatus.

FIG. 9B shows the front view of the tab cassette, according to an embodiment of the present invention. As shown in FIG. 9A and FIG. 9B, front cover 902 includes handle bar 908. During operation, a human operator can grab handle bars 908 to disengage tab cassette 900 from a frame, to which tab cassette 900 is attached. Additionally, it is also possible to disengage tab cassette 900 from the frame using an automated machine.

Figure 9D:
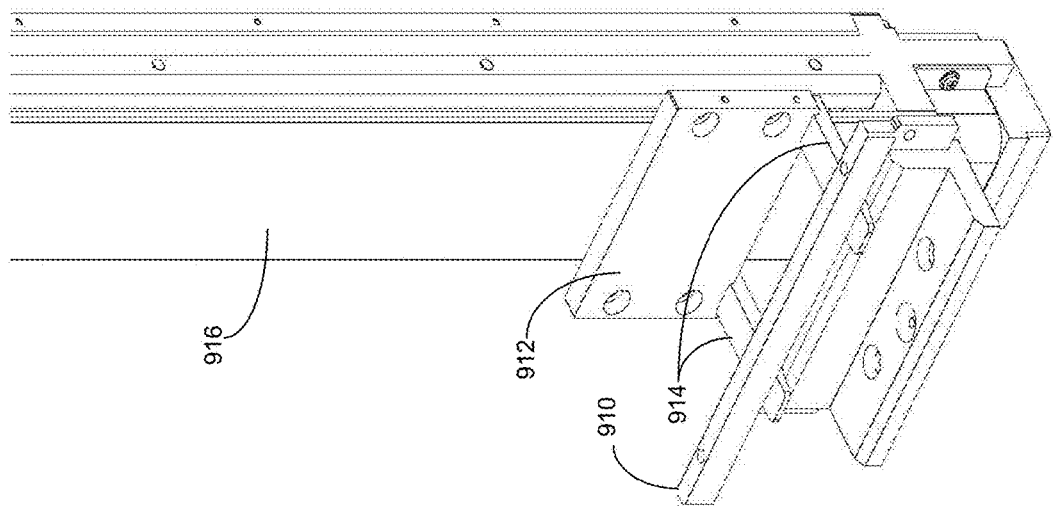
FIG. 9D shows the tab elevator and the remaining parts of the tab-elevating module, according to an embodiment of the present invention.
Figure 9C:
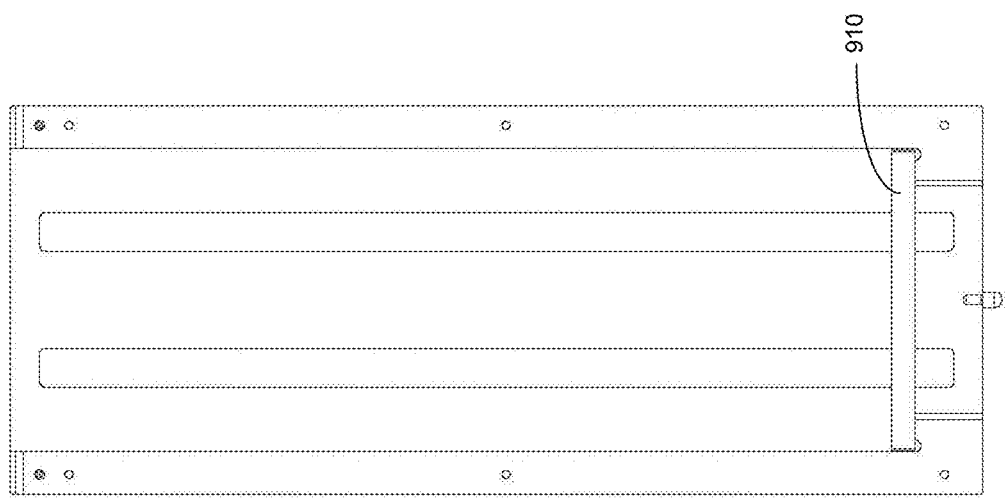
FIG. 9C shows the front view of the tab cassette with the front cover removed, according to an embodiment of the present invention.

FIG. 9C shows the front view of the tab cassette with the front cover removed, according to an embodiment of the present invention. Removing the front cover reveals tab elevator 910, which can be positioned between the front cover and the back cover. During normal operation, tab elevator 910 moves up when tabs have been picked up from the top of the stack to push remaining tabs upward. FIG. 9D shows the tab elevator and the remaining parts of the tab-elevating module, according to an embodiment of the present invention. As shown in FIG. 9D, the upward movement of tab elevator 910 can be driven by back plate 912 and supporting pegs 914. Back plate 912 can be pushed up along column 916 by an actuating mechanism (not shown in the drawings). In some embodiments, the actuating mechanism can include a spring-loading system, similar to the spring-loading system used in the firearm magazines.

Figure 9E:
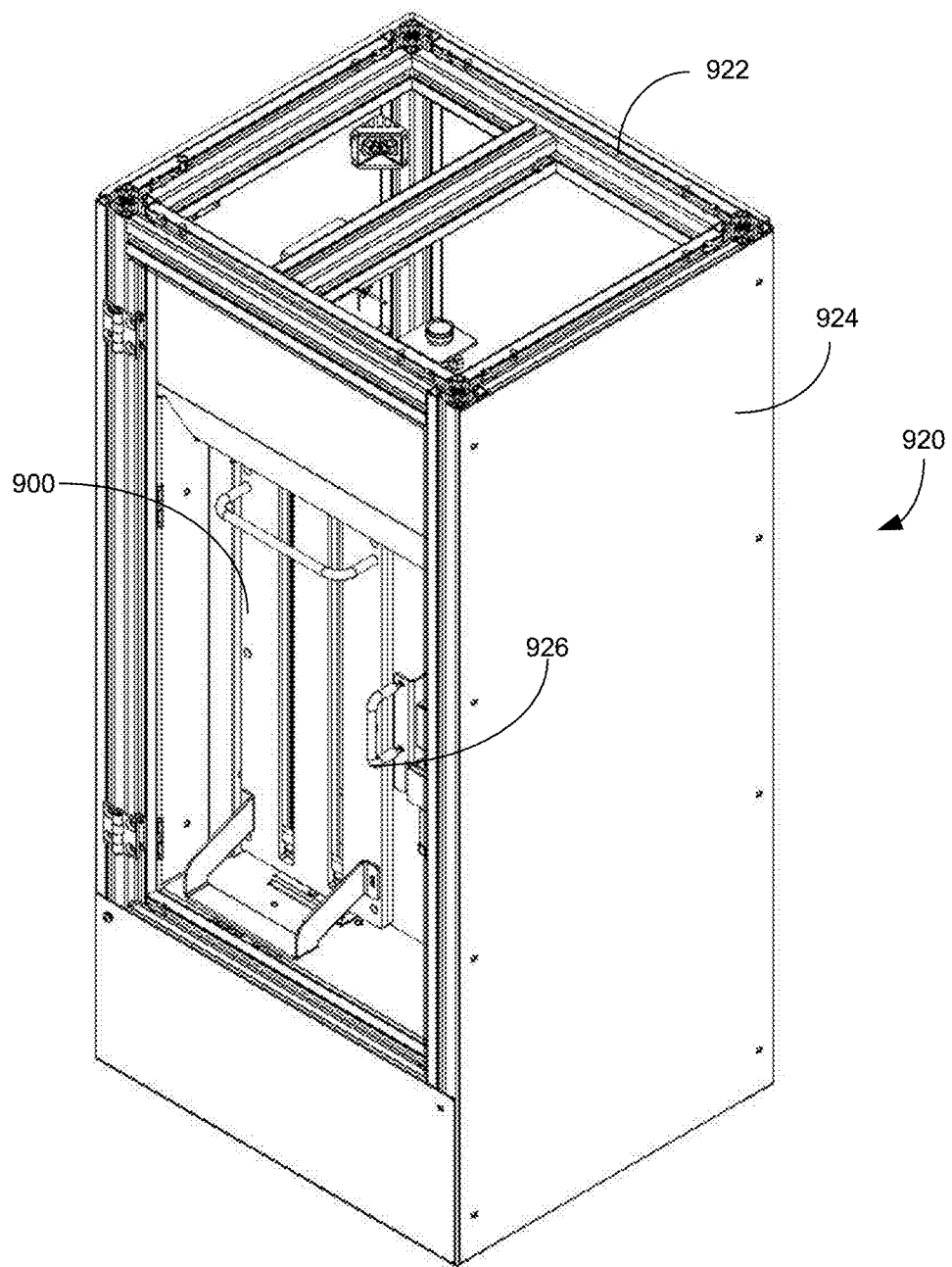
FIG. 9E shows the perspective view of the cassette enclosure, according to an embodiment of the present invention.

In some embodiments, the tab cassette can be placed in a physical enclosure. FIG. 9E shows the perspective view of the cassette enclosure, according to an embodiment of the present invention. As shown in FIG. 9E, cassette enclosure 920 includes frame 922, one or more non-transparent walls 924, and a transparent door 926. Tab cassette 900 is surrounded by frame 922 and positioned behind transparent door 926. Frame 922 not only support the non-transparent walls around cassette 900, but also provides structural support to cassette 900. More specifically, cassette 900 is attached to a rigid beam (not shown in FIG. 9E) that coupled to frame 922. During operation, if tab cassette 900 needs to be replaced, an operator can open transparent door 926, disengage cassette 900 from the rigid beam, and attach a cassette loaded with tabs to the rigid beam.

Figure 10A:
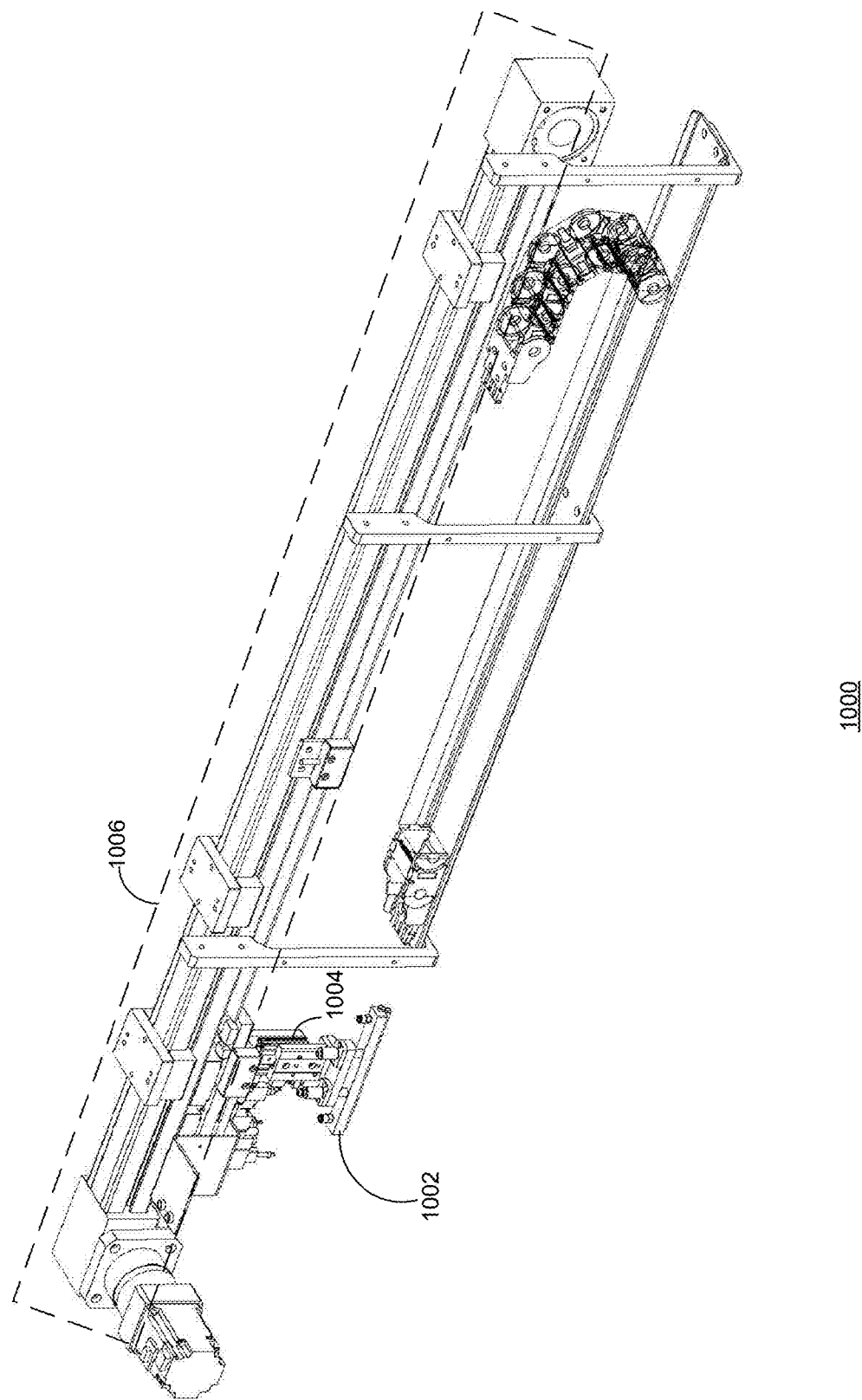
FIG. 10A shows the perspective view of the pick-and-place apparatus, according to an embodiment of the present invention.

FIG. 10A shows the perspective view of the pick-and-place apparatus, according to an embodiment of the present invention. In FIG. 10A, pick-and-place apparatus 1000 includes tab holder 1002, vertical expander 1004, and horizontal track 1006.

Figure 10B:
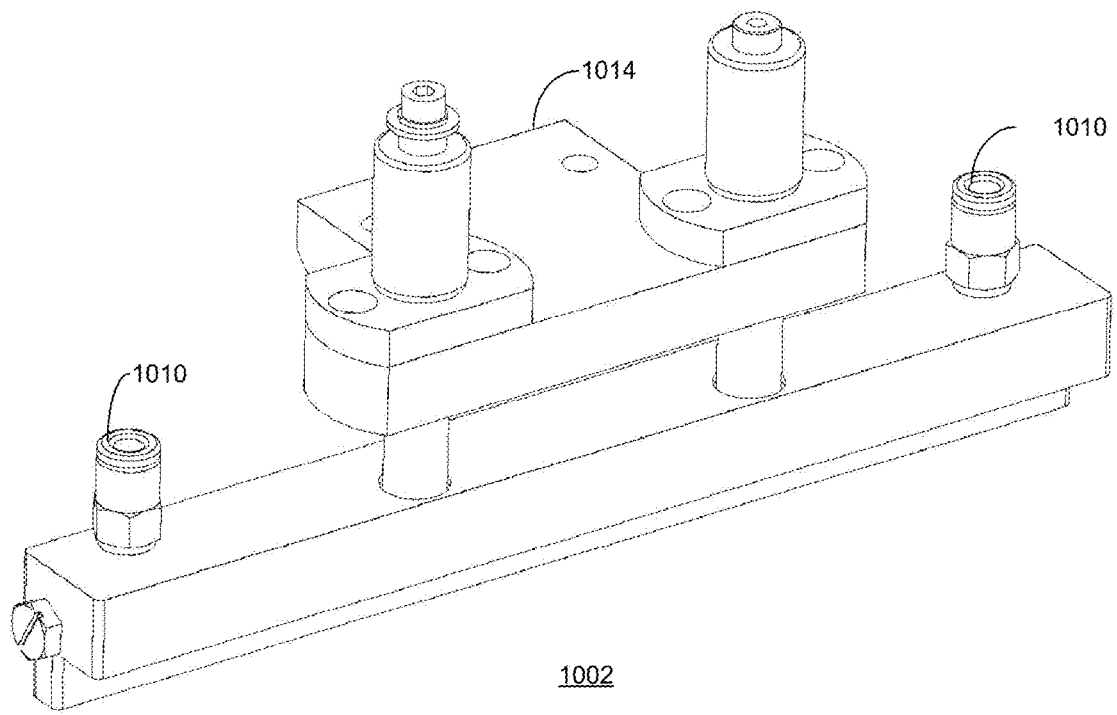
FIG. 10B shows the perspective view of the tab holder, according to an embodiment of the present invention.
Figure 10C:
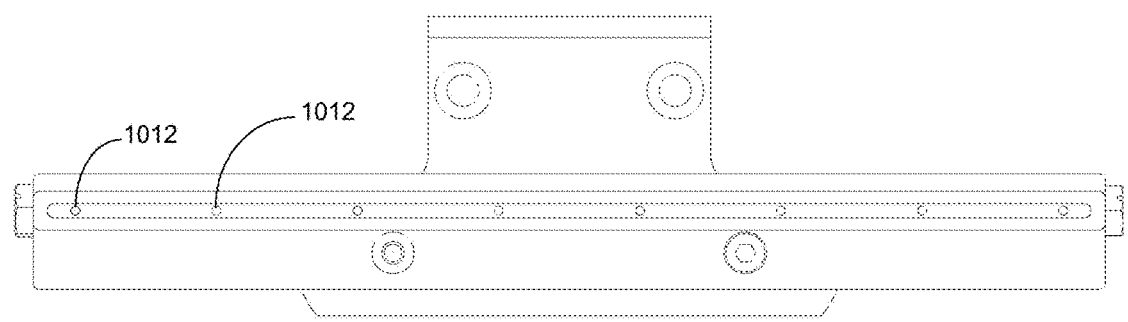
FIG. 10C shows the bottom view of the tab holder, according to one embodiment of the present invention.

FIG. 10B shows the perspective view of the tab holder, according to an embodiment of the present invention. FIG. 10C shows the bottom view of the tab holder, according to one embodiment of the present invention. Tab holder 1002 is responsible for picking up a tab from the top opening of the tab cassette and for holding the tab while it is being transported to the desired location. In some embodiments, tab holder 1002 can include one or more suction cups (not shown in the drawing) that can hold the tab by creating a weak vacuum between the tab and the suction cups. The weak vacuum can be generated via valves 1010 (shown in FIG. 10B) and holes 1012 (shown in FIG. 10C), and the suction cups can couple to holes 1012. The suction cups often are made of soft materials, such as rubber, to prevent damages to the tab surface. After a tab has been transported to the desired location, such as being placed over the end busbar of a string, the tab can be released from the suction cups by removing the vacuum. Tab holder 1002 can further include attachment plate 1016 for attaching the tab holder to the vertical expander.

Figure 10E:
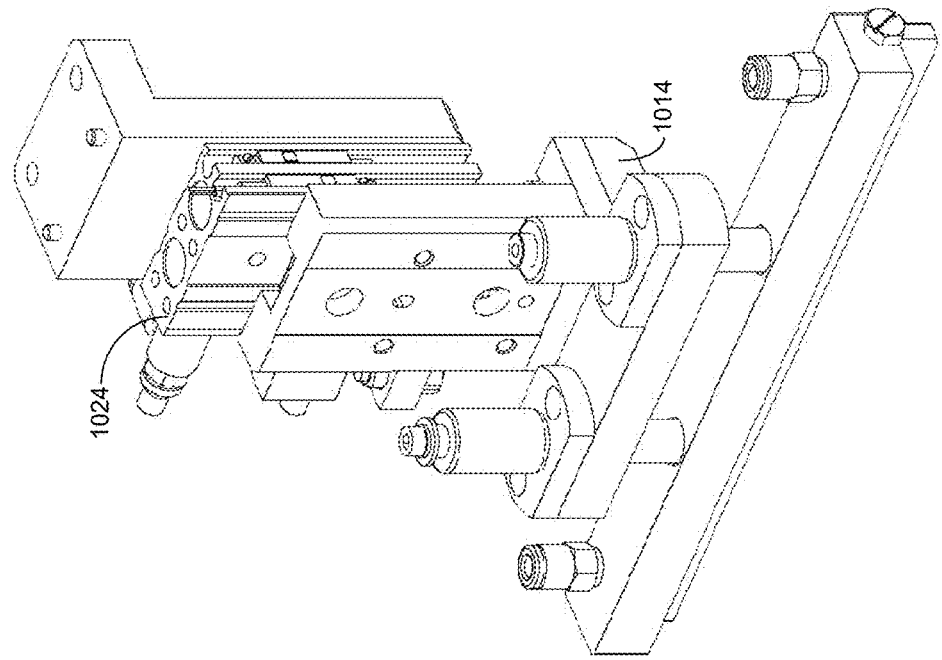
FIG. 10E shows the coupling between the tab holder and the vertical expander, according to an embodiment of the present invention.
Figure 10D:
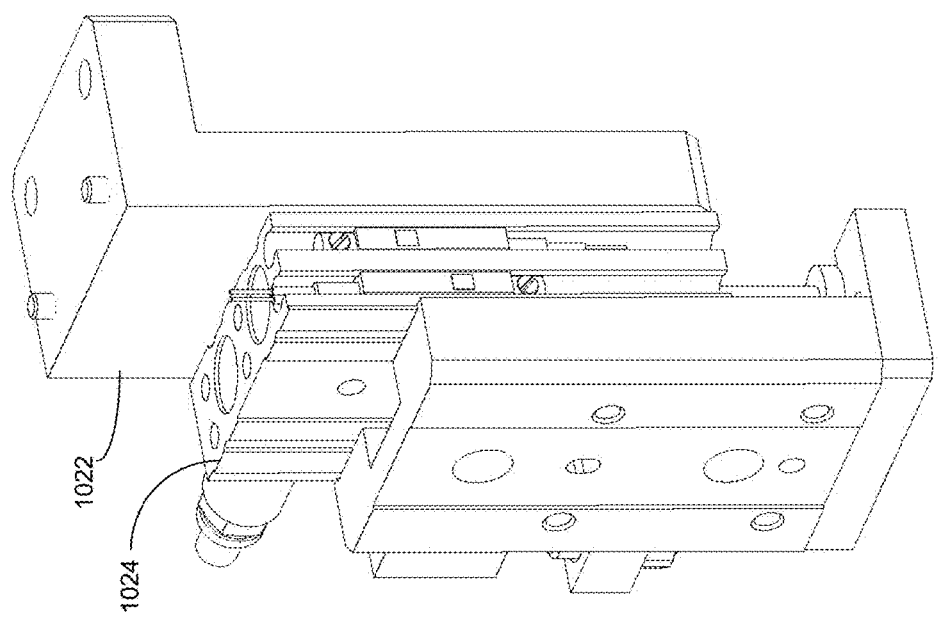
FIG. 10D shows the perspective view of the vertical expander, according to an embodiment of the present invention.

FIG. 10D shows the perspective view of the vertical expander, according to an embodiment of the present invention. Vertical expander 1004 can be responsible for moving the tab holder in the vertical direction. For example, each time the tab holder picks up a tab from the tab cassette vertical expander 1004 can expand to lower the tab holder 1002 to allow the suction cups to come into contact with the to-be-picked-up tab. Subsequent to the tab being attached to the suction cups, vertical expander 1004 contracts, lifting up the tab to clear possible obstacles in the horizontal direction. Similarly, each time the tab holder places a tab at the end of a string, vertical expander 1004 expands to lower the tab holder to allow the tab to come into contact with the surface of the string.

As one can imagine, due to the fragility of the string, the vertical movement of the tab holder needs to be controlled precisely to prevent damages to the string. Various control mechanisms can be used to control the expansion and contraction of vertical expander 1004, including but not limited to: push pins, screws, translation stages, etc. In the example shown in IF. 10D, vertical expander 1004 includes supporting base 1022 and single-axis translation stage 1024. In some embodiments, a step motor with feedback control can be used to control the movement of the translation stage. In further embodiments, the feedback control can include an optical encoder that measures the actual movement of the step motor precisely. By carefully measuring the distance to the tab cassette and to the surface of the string and calibrating the step motor, one can precisely control the vertical movement of the tab holder. As a result, the tabs are barely contacting the string surface when they are placed at the end of the string, thus preventing excessive downward forces being applied to the string. FIG. 10E shows the coupling between the tab holder and the vertical expander, according to an embodiment of the present invention.

Figure 10F:
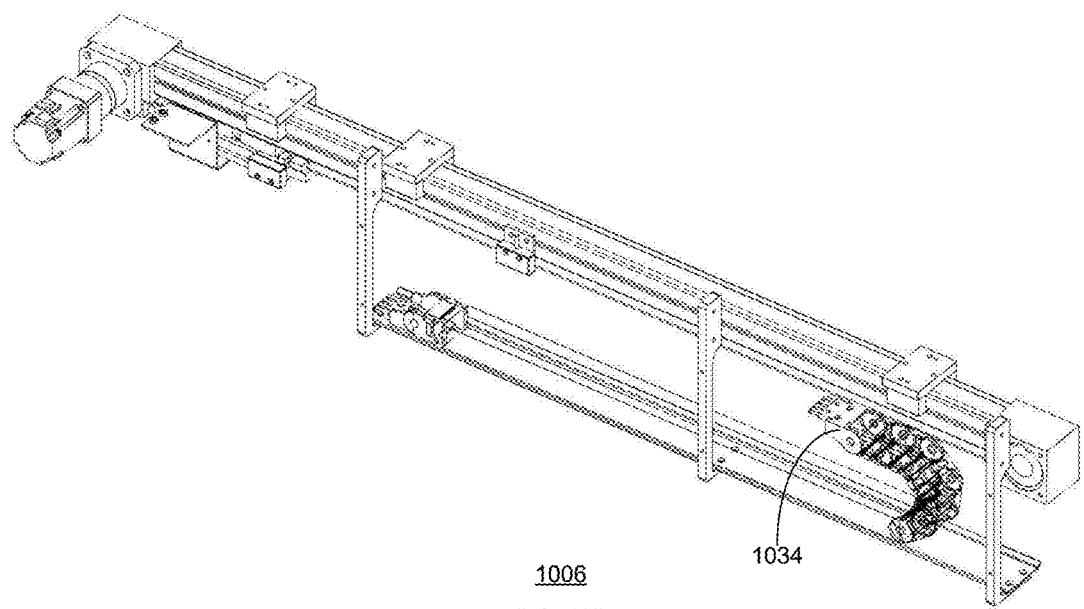
FIG. 10F shows the perspective view of the horizontal track, according to an embodiment of the present invention.
Figure 10G:
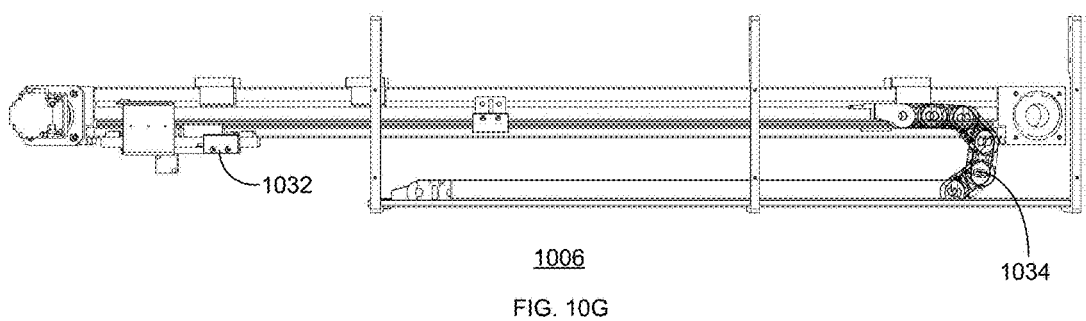
FIG. 10G shows the front view of the horizontal track, according to an embodiment of the present invention.
Figure 10H:
FIG. 10H shows the back view of the horizontal track, according to an embodiment of the present invention.

FIG. 10F shows the perspective view of the horizontal track, according to an embodiment of the present invention. FIG. 10G shows the front view of the horizontal track, according to an embodiment of the present invention. FIG. 10H shows the back view of the horizontal track, according to an embodiment of the present invention. Horizontal track 1006 is responsible for transporting the tab holder in the horizontal direction. In the example shown in FIGS. 10E-10H, the vertical expander can be attached to horizontal track 1006 via attachment module 1032. When attachment module 1032 glides along horizontal track 1006, the tab holder is transported accordingly.

Figure 10I:
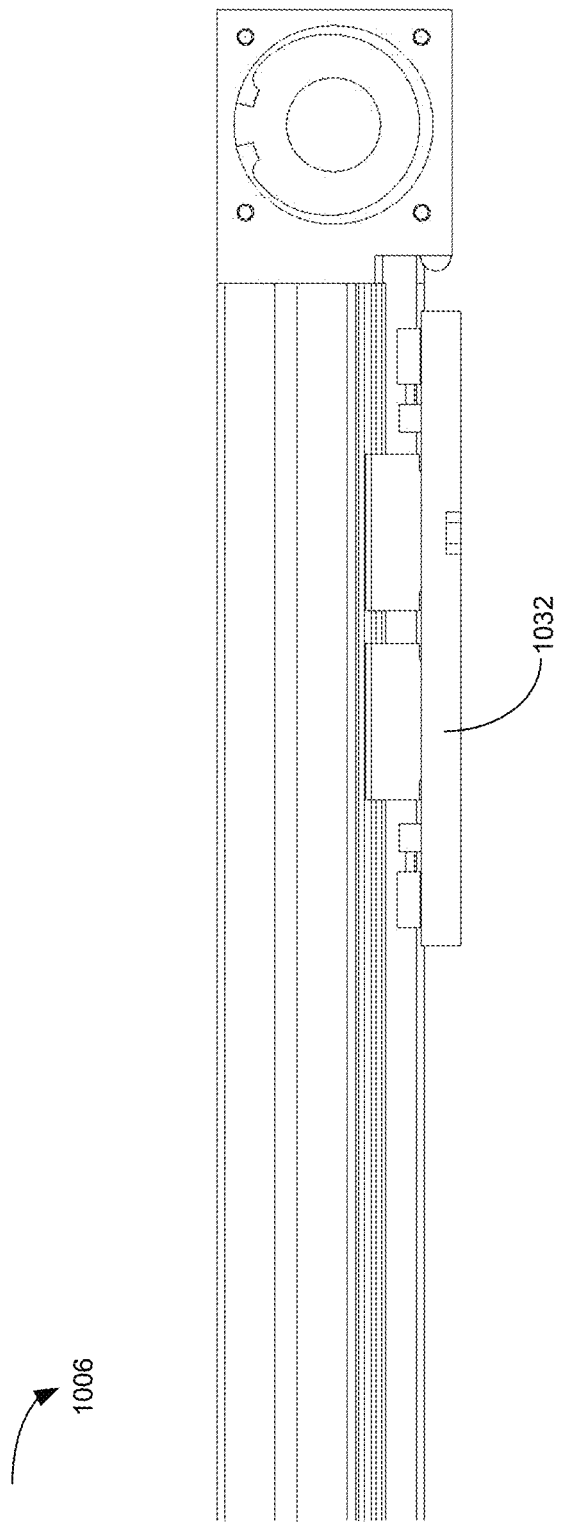
FIG. 10I shows the coupling between the attachment module and the base of the horizontal track, according to an embodiment of the present invention.

After the tab has been picked up by the tab holder, it needs to be placed at the end of a to-be-tabbed string, which is often carried by a conveyor. Because a solar panel production line can include multiple parallel conveyors to allow parallel processing of multiple strings, the tab holder often needs to travel horizontally cross one or more conveyors in order to place tabs onto strings that are located on the different conveyors. In some embodiments, horizontal track 1006 can include an actuating mechanism, which can actuate attachment module 1032 back and forth along horizontal track 1006. In further embodiments, the actuating mechanism can include a step motor with a feedback control, which can precisely control the movement of attachment module 1032 along the track. In some embodiments, horizontal track 1006 may include a pulley system, and attachment module 1032 can act as the carriage with the pulley system. The pulley system can be driven by an electrical motor. Depending on the rotating direction of the pulley wheels, carriage 1032 can glide back and forth along the horizontal track. FIG. 10I shows in more detail the coupling between the attachment module and the base of the horizontal track, according to an embodiment of the present invention.

Horizontal track 1006 can further include chain-based cable/hose carrier 1034 (shown in FIGS. 10F and 10G), which carries hoses and cables (not shown in the drawing) that support the operations of the tabbing machine. For example, to create the weak vacuum used for holding the tab in midair, the tab holder needs to be connected to a vacuum pump via hoses. Similarly, the various actuating mechanisms, both the vertical and the horizontal ones, need to be connected to power and control via various electrical/control cables. Placing the hoses and cables in carrier 1034 prevents damages to these hoses and cables and ensures operational reliability.

Figure 11:
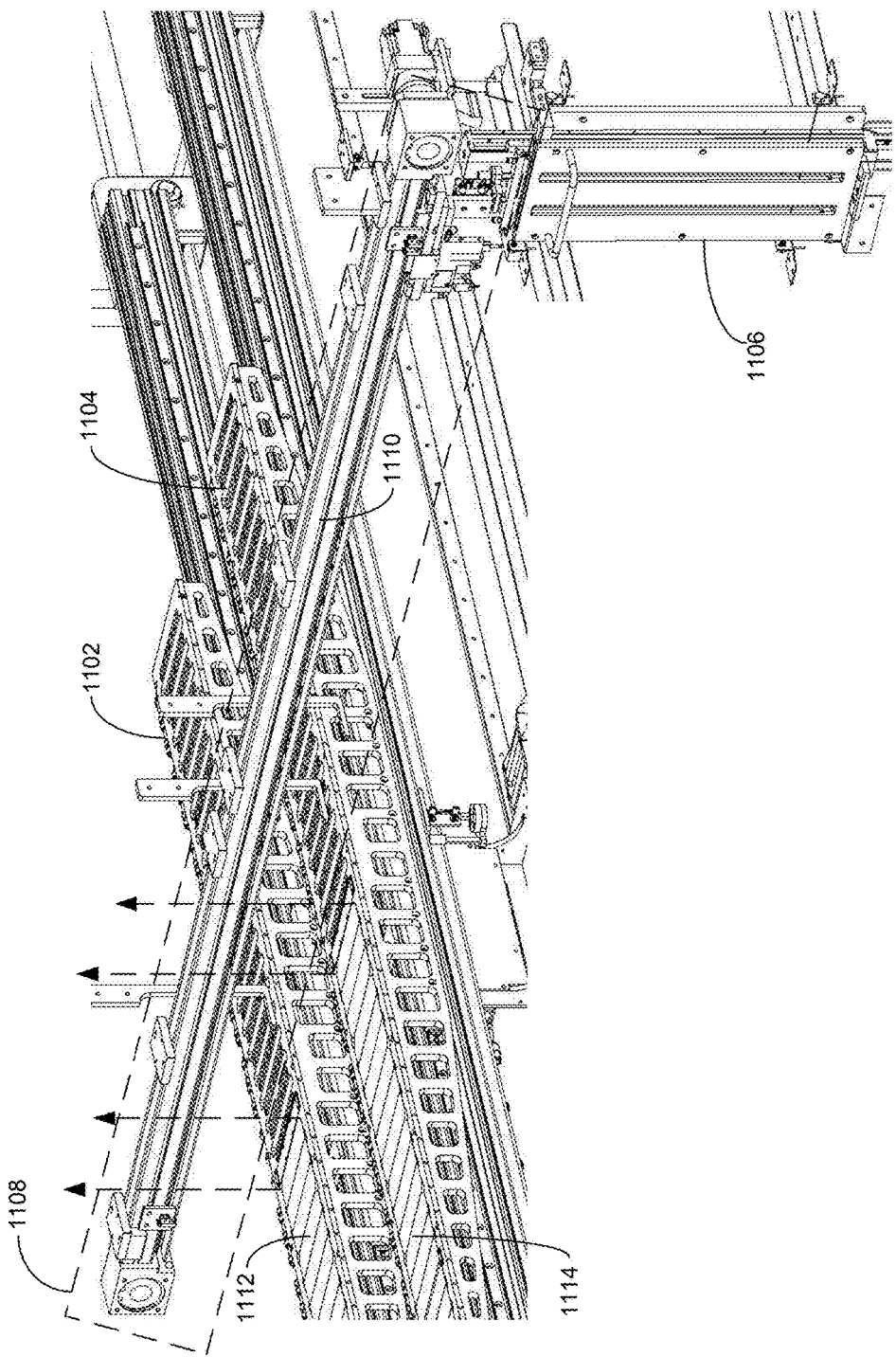
FIG. 11 shows an integrated system with conveyors and a tabbing machine, according to an embodiment of the present invention.

FIG. 11 shows an integrated system with conveyors and a tabbing machine, according to an embodiment of the present invention. In FIG. 11, integrated system 1100 includes multiple conveyors, such as conveyors 1102 and 1104, tab cassette 1106, and pick-and-place apparatus 1108.

During panel fabrication, the conveyors can transport the wafers or strips to different work stations, including: scribing, paste application, cleaving, testing, string lay-up, etc. In the example shown in FIG. 11, conveyors 1102 and 1104 carry finished strings, such as strings 1112 and 1114, to desired locations with respect to the tabbing machine. More specifically, conveyors 1102 and 1104 are configured to align strings 1112 and 1114 along the conveyor moving direction in such a way that the ends of the strings are directly under the tab holder when the tab holder moves to desired positions along horizontal track 1110, as indicated by the dashed arrows. Proper alignment allows that, when the tab holder is lowered by the vertical expander, the tab held by the tab holder can be in contact with the busbar situated at the end of the string. Movements of the conveyors can be precisely controlled to ensure the proper alignment. For example, the motor that drives a conveyor can be coupled to a feedback control, such as an optical encoder that can measure the distance travelled by the conveyor. Such a feedback control can precisely control the movement of the conveyor, and hence the location of the string. Moreover, additional visioning mechanisms, such as a laser vision module which can detect the end busbar, can be used to assist the alignment of the string.

Because conveyors 1102 and 1104 carry strings 1112 and 1114 from other work stations without flipping over the strings, the orientation of the strings can be limited by requirements of the other work stations. More specifically, to prevent possible damages cause by the laser beam to the base-to-emitter junction of a photovoltaic structure, it is desirable to perform laser scribing on a side of the base layer that is opposite to the emitter. If the photovoltaic structure includes a surface-field layer, it is desirable to apply the laser beam on the side of the surface-field layer. In such scenarios, it is easier to ensure that a groove generated by the laser beam does not penetrate the base layer to reach the base-to-emitter interface. To accommodate the scribing operation, strings, such as strings 1112 and 1114, are placed on the conveyors with the top-facing side being the side of the surface-field layer. Consequently, when tabs are being attached to the strings by pick-and-place apparatus, they are attached to the surface-field-layer side of the strings.

In some embodiments, the conveyor can include a vacuum holding mechanism that holds the strings in place. Hence, by controlling the movement of the conveyor one can determine precisely positions of the strings. For example, the surface of the conveyor may include holes that can produce a weak vacuum between the conveyor and a string when covered by the string. Such a weak vacuum can create a suction force to hold the string in place without damaging it. Alternatively, the conveyor may include borders or edges that can physically confine the strings, such as confining movements of the strings in the direction perpendicular to the moving direction of conveyor. For example, the width of the conveyor may be such that it matches the width of the string so that no lateral alignment is needed, and when the strings are carried by the conveyor, they remain in the intended positions since there is no room for them to move. In the rare scenario where a string shifts its location while being carried by the conveyor, a visioning mechanism can be used to determine the true location of the string. In some embodiments, the visioning mechanism may include a camera that can capture images of a string being carried by the conveyor. A computer controller can run an image processing application to compare the captured image with a reference image. The comparison output can then be used to determine the true location of the string. Alternatively, the visioning mechanism may be laser-based, which uses a laser beam to scan the surface of the string and detects the location of the busbar based on the difference in the refractive indices between the semiconductor and the conductive busbar. A laser-based visioning mechanism may also be able to detect the edge (either a leading edge or a trailing edge) of a string based on the difference in the refractive indices between the string surface and the conveyor surface. In some embodiments, once the leading edge of a string is detected, the displacement between the current location of the leading edge and the desired location of the leading edge (i.e., being aligned to the tabbing machine) can be calculated, and a controlling module of the conveyor can control the conveyor to move a distance equal to the calculated displacement, thus aligning the leading edge of the string to the tabbing machine.

Upon a string being aligned with respect to the tabbing machine, the conveyor can pause, and the pick-and-place apparatus can pick up a tab from tab cassette 1106 and place the tab at the edge of the string. Placing the tab can involve the vertical expander lowering the tab holder. In the examples shown in FIG. 10D, vertical expander 1004 includes a single-axis translation stage, meaning it can only move in one dimension. In practice, it is also possible to implement a vertical expander that has at least two degrees of freedom. For example, in addition to vertical movements, the vertical expander may also able to rotate in the horizontal plane. Hence, if the busbar is slightly misaligned (e.g., not aligned in a direction perpendicular to the conveyor moving direction), the vertical expander is able to rotate accordingly. As a result, the to-be-attached tab can rotate midair to align to the end busbar of the string.

Subsequent to the tab placement, the conveyor can resume its movement, carrying the tabbed string to subsequent workstations. In some embodiments, the tabbed string can subsequently go through an annealing process to cure the conductive paste. The annealed, tabbed strings are then laid out in a panel format and encapsulated into the front and back covers of the panel. The tabbing process can typically take a time period ranging from a few hundred milliseconds to a few seconds. Such a rapid process contributes to the high throughput of the entire panel production line.

In the example shown in FIG. 11, a tabbing machine services two conveyors. The operation of these conveyors can controlled be independent of each other, and the tabbing machine can be configured to coordinate its own operation with the operations of the conveyors. For example, if both conveyors are ready (with strings aligned), the tabbing machine can service the two conveyors one by one, stating from the closer one or the one that is further away. More superficially, the tab holder may pick up one tab and move along the horizontal track to place the tab on one string; and then the tab holder moves back to pick up a second tab from the cassette and moves along the horizontal track to place the second tab onto the second string. Alternatively, if one conveyor is ready while the other conveyor is still transporting and aligning a string, the tabbing machine can service the ready conveyor first.

In practice, a tabbing machine can service fewer or more conveyors. Due to the back-and-forth trips needed by the tab holder for placing the tabs, having one tabbing machine to serve too many conveyors may reduce throughput. A solution to such a problem can be using multiple tabbing machines in a panel production line, with each tabbing machine servicing a few conveyors. For example, a panel production line can include four or more parallelly operated conveyors and two or more tabbing machine, and each tabbing machine can be configured to service at least two conveyors.

Figure 12:
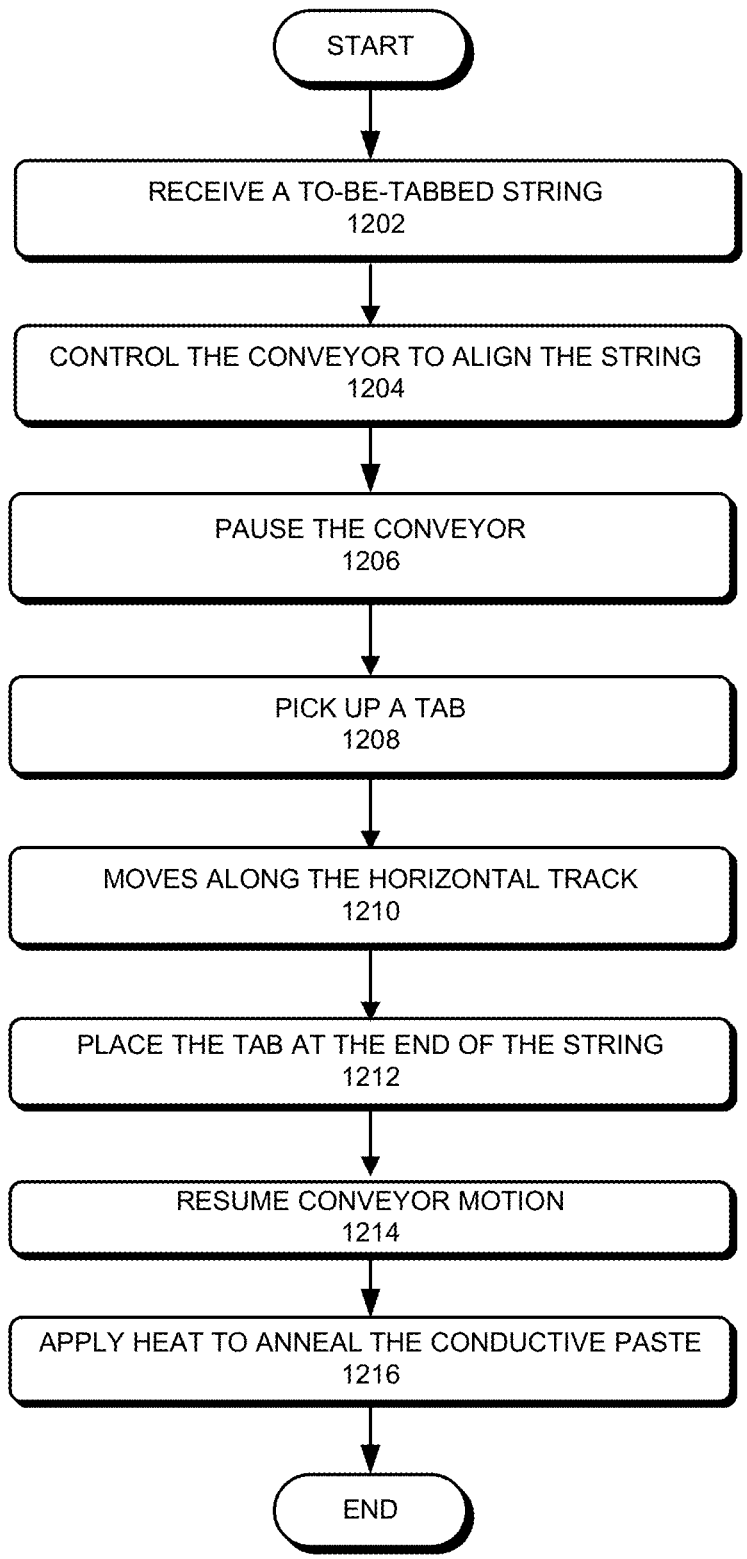
FIG. 12 shows an exemplary process of attaching a tab to a cascaded string, in accordance with an embodiment of the present invention.

FIG. 12 shows an exemplary process of attaching a tab to a cascaded string, in accordance with an embodiment of the present invention. During operation, the tabbing machine receives a to-be-tabbed string on the conveyor (operation 1202). The to-be-tabbed string typically has gone through the scribing, cleaving, and cascading process. More specifically, the to-be-tabbed string includes an array of edge-stacked strips. Conductive paste has been applied onto the top edge busbar of each strip. The only exposed edge busbar of the entire string is located at the end of the string. In some embodiments, the string can be oriented in such a way that the end that first approaches the tabbing machine can be the end of the string having the exposed busbar. In other words, the tabbing machine will place a tab at the string end that approaching the tabbing machine the first. In addition to a cascaded string, the tabbing machine can also receive other types of device or structure on the conveyor. For example, the tabbing machine can receive an individual photovoltaic structure on the conveyor, and can be configured to attach a tab to an edge of the individual photovoltaic structure.

Prior to tab placement, the tabbing machine may control the conveyor to align the string or photovoltaic structure (operation 1204). Controlling the conveyor may involve programming the conveyor to travel a predetermined distance. For example, the distance between the tabbing machine and the previous work station may be carefully measured, and the motor driving the conveyor may include feedback control to ensure that the conveyor travel distance is well controlled. In some embodiments, a visioning mechanism can also be used to assist the string alignment. Once desired alignment is achieved, the conveyor movement is paused (operation 1206).

Upon the string being aligned and the conveyor paused, the tab holder picks up a tab from the tab cassette (operation 1208), moves along a horizontal track to a location above the string end (operation 1210), and places the tab at the end of the string (operation 1212). Subsequent to the tab placement, the motion of the conveyor is resumed (1214). To complement the tab attachment, the string and the tab are carried to an annealing station, where heat is applied to cure the conductive paste (operation 1216).

In summary, the present disclosure describes a system for attaching a conductive tab at the edge of a photovoltaic structure, which may be a standalone device or part of a string. Such a conductive tab working in conjunction with a conductive backsheet enables single-sided inter-string electrical connections. The tabbing system can include a cassette for holding the to-be-attached tabs and a pick-and-place apparatus for picking up a tab from the cassette and placing the tab at the end of the cascaded string. The location of the string and the movement of the pick-and-place apparatus are precisely controlled to ensure that the tab is placed at the proper location to achieve its desired function.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. An apparatus for attaching conductive tabs to photovoltaic structures, comprising:
   a cassette configured to store a plurality of conductive tabs; and
   a pick-and-place apparatus configured to obtain a conductive tab from the cassette and place the conductive tab on a first side of a photovoltaic structure so that a first portion of the conductive tab contacts a busbar extending along an edge of the first side of the photovoltaic structure and a second portion of the conductive tab extends beyond the edge of the photovoltaic structure to allow for an electrical connection to be made to the conductive tab from a second side of the photovoltaic structure, opposite the first side, wherein the pick-and-place apparatus further comprises:
      a tab holder configured to obtain and release the conductive tab; and
      a track coupled to the tab holder, wherein the tab holder is further configured to move back and forth along the track.

2. The apparatus of claim 1, wherein the pick-and-place apparatus further includes an expander coupled to the tab holder, and wherein the expander is configured to move the tab holder in a direction that intersects with the track.

3. The apparatus of claim 2, wherein the expander further includes a translation stage driven by a step motor.

4. The apparatus of claim 2, wherein the track further includes an attachment mechanism configured to attach the expander to the track and an actuation mechanism configured to actuate the attachment mechanism back and forth along the track.

5. The apparatus of claim 1, wherein the conductive tabs are stacked vertically in the cassette, and wherein the cassette further includes a stack-elevating mechanism configured to push up the stack of tabs subsequent to the conductive tab being picked up by the pick-and-place apparatus.

6. The apparatus of claim 5, wherein the elevating mechanism includes a compression spring.

7. The apparatus of claim 1, wherein the tab holder includes at least one suction cup.

8. The apparatus of claim 1, further comprising a conveyor controller configured to control movements of a conveyor carrying the photovoltaic structure along a path substantially perpendicular to the track, thereby facilitating aligning the edge of the photovoltaic structure to the tab holder.

9. The apparatus of claim 1, wherein the conductive tab is selected from a group consisting of:
   a metallic tab;
   a conductive non-metallic tab; and
   a conductive core partially covered by an insulation layer.

10. The apparatus of claim 1, wherein the conductive tab has a two-step stair shape wherein the first portion of the conductive tab is offset from the second portion by a thickness of the photovoltaic structure.

11. A system for attaching conductive tabs to photovoltaic structures, comprising:
    a conveyor for carrying a photovoltaic structure along a path;
    a cassette configured to store a plurality of conductive tabs; and
    a pick-and-place apparatus configured to obtain a conductive tab from the cassette and place the conductive tab on a first side of the photovoltaic structure so that a first portion of the conductive tab contacts a busbar extending along an edge of the first side of the photovoltaic structure and a second portion of the conductive tab extends beyond the edge of the photovoltaic structure to allow for an electrical connection to be made to the conductive tab from a second side of the photovoltaic structure, opposite the first side, wherein the pick-and-place apparatus further comprises:
       a tab holder configured to obtain and release the conductive tab; and
       a track coupled to the tab holder, wherein the track is oriented in a direction that intersects with the path, and
    wherein the tab holder is further configured to move back and forth along the track.

* * * * *